(12) United States Patent
Lee et al.

(10) Patent No.: US 9,773,699 B2
(45) Date of Patent: Sep. 26, 2017

(54) METHODS OF FORMING WIRING STRUCTURES INCLUDING A PLURALITY OF METAL LAYERS

(71) Applicant: Samsung Electronics Co., Ltd., Suwon-si, Gyeonggi-do (KR)

(72) Inventors: Jong-Jin Lee, Seoul (KR); Rak-Hwan Kim, Suwon-si (KR); Byung-Hee Kim, Seoul (KR); Jin-Nam Kim, Anyang-si (KR); Tsukasa Matsuda, Seongnam-si (KR); Wan-Soo Park, Suwon-si (KR); Nae-In Lee, Seoul (KR); Jae-Won Chang, Hwaseong-si (KR); Eun-Ji Jung, Hwaseong-si (KR); Jeong-Ok Cha, Seoul (KR); Jae-Won Hwang, Seongnam-si (KR); Jung-Ha Hwang, Gunpo-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/000,302

(22) Filed: Jan. 19, 2016

(65) Prior Publication Data
US 2016/0293484 A1   Oct. 6, 2016

(30) Foreign Application Priority Data

Apr. 2, 2015   (KR) .................... 10-2015-0047026

(51) Int. Cl.
*H01L 21/76*   (2006.01)
*H01L 21/768*   (2006.01)
(Continued)

(52) U.S. Cl.
CPC .. *H01L 21/76882* (2013.01); *H01L 21/76877* (2013.01); *H01L 23/522* (2013.01);
(Continued)

(58) Field of Classification Search
CPC ......... H01L 21/76879; H01L 21/76816; H01L 21/76843; H01L 21/76802;
(Continued)

(56) References Cited

U.S. PATENT DOCUMENTS 6,989,583 B2   1/2006 Fujii
7,439,623 B2*  10/2008 Harada ............. H01L 21/76802
                                                    257/750

(Continued)

FOREIGN PATENT DOCUMENTS

JP   10-098039 A    4/1998
JP   2010-278330 A  12/2010
(Continued)

*Primary Examiner* — Scott B Geyer
(74) *Attorney, Agent, or Firm* — Harness, Dickey & Pierce, P.L.C.

(57) ABSTRACT

In a method of forming a wiring structure, a lower structure is formed on a substrate. An insulating interlayer is formed on the lower structure. The insulating interlayer is partially removed to form at least one via hole and a dummy via hole. An upper portion of the insulating interlayer is partially removed to form a trench connecting the via hole and the dummy via hole. A first metal layer filling the via hole and the dummy via hole is formed. A second metal layer filling the trench is formed on the first metal layer.

15 Claims, 28 Drawing Sheets

(51) Int. Cl.
  *H01L 23/522* (2006.01)
  *H01L 23/528* (2006.01)
  *H01L 23/532* (2006.01)

(52) U.S. Cl.
  CPC ...... *H01L 23/5226* (2013.01); *H01L 23/5283* (2013.01); *H01L 23/53238* (2013.01); *H01L 21/76807* (2013.01); *H01L 21/76843* (2013.01); *H01L 21/76864* (2013.01)

(58) Field of Classification Search
  CPC ......... H01L 21/76804; H01L 21/76807; H01L 21/76838; H01L 21/76841; H01L 21/76846; H01L 21/7685; H01L 21/76877–21/76883; H01L 23/522; H01L 23/5283; H01L 23/53228; H01L 23/53238; H01L 21/76871; H01L 21/76873; H01L 21/76874; H01L 21/76876
  See application file for complete search history.

(56) References Cited

U.S. PATENT DOCUMENTS

| | | | |
|---|---|---|---|
| 7,459,787 B2 | 12/2008 | Young | |
| 7,545,045 B2 | 6/2009 | Huang et al. | |
| 8,008,782 B2* | 8/2011 | Kageyama | H01L 23/522 257/758 |
| 8,242,015 B2 | 8/2012 | Matsumoto et al. | |
| 8,836,126 B2* | 9/2014 | Ochimizu | H01L 21/76807 257/741 |
| 8,859,422 B2 | 10/2014 | Ishizaka et al. | |
| 2006/0258151 A1* | 11/2006 | Young | H01L 23/5226 438/638 |
| 2008/0090410 A1* | 4/2008 | Sakata | C23C 16/045 438/643 |
| 2009/0121353 A1 | 5/2009 | Ramappa et al. | |
| 2010/0224996 A1* | 9/2010 | Cunningham | H01L 21/76805 257/751 |
| 2011/0210445 A1* | 9/2011 | Harada | H01L 21/76802 257/751 |
| 2012/0015517 A1* | 1/2012 | Oshida | H01L 21/76883 438/667 |
| 2012/0025382 A1* | 2/2012 | Riess | H01L 21/76808 257/751 |
| 2012/0064717 A1 | 3/2012 | Kato et al. | |
| 2013/0237053 A1 | 9/2013 | Ishizaka et al. | |
| 2014/0264903 A1* | 9/2014 | Chen | H01L 23/5329 257/774 |
| 2015/0325522 A1* | 11/2015 | Yeh | H01L 21/2855 257/741 |
| 2016/0204060 A1* | 7/2016 | Chi | H01L 21/76843 257/751 |

FOREIGN PATENT DOCUMENTS

| | | |
|---|---|---|
| KR | 10-0483201 B1 | 4/2005 |
| KR | 2013-0096949 A | 9/2013 |

* cited by examiner

FIRST      SECOND
DIRECTION  DIRECTION

METHODS OF FORMING WIRING STRUCTURES INCLUDING A PLURALITY OF METAL LAYERS

CROSS-REFERENCE TO RELATED APPLICATION

This application claims priority under 35 USC §119 to Korean Patent Application No. 10-2015-0047026, filed on Apr. 2, 2015 in the Korean Intellectual Property Office (KIPO), the contents of which are incorporated by reference herein in their entirety.

BACKGROUND

1. Field

Some example embodiments relate to wiring structures, methods of forming wiring structures and/or methods of manufacturing semiconductor devices. Other example embodiments relate to wiring structures including a plurality of metal layers, methods of forming the same and/or methods of manufacturing semiconductor devices including the same.

2. Description of the Related Art

In a semiconductor device, a wiring structure for interconnection, e.g., a via structure or a contact, may be formed so that signal lines at different levels may be connected to each other. For example, an opening through which a lower conductive pattern is exposed may be formed, and a metal may be deposited in the opening to form the wiring structure.

As a degree of integration of the semiconductor device increases, a width and a pitch of the opening may also decrease. Thus, a deposition property in the opening may be deteriorated.

SUMMARY

Example embodiments provide a wiring structure having improved reliability and minute dimension.

Example embodiments also provide a method of forming a wiring structure having improved reliability and minute dimension.

Example embodiments also provide a method of manufacturing a semiconductor device including the wiring structure.

According to example embodiments, there is provided a method of forming a wiring structure. In the method, a lower structure is formed on a substrate. An insulating interlayer is formed on the lower structure. The insulating interlayer is partially removed to form at least one via hole and a dummy via hole. An upper portion of the insulating interlayer is partially removed to form a trench connecting the via hole and the dummy via hole. A first metal layer filling the via hole and the dummy via hole is formed. A second metal layer filling the trench is formed on the first metal layer.

In example embodiments, before forming the first metal layer, a liner layer may be formed along sidewalls and bottom surfaces of the via hole, the dummy via hole and the trench.

In example embodiments, the liner layer may be formed of a CVD-Ru (Chemical Vapor Deposition-Ruthenium).

In example embodiments, the first metal layer may be formed by a reflow process.

In example embodiments, the second metal layer may be formed by a plating process using the first metal layer as a seed.

In example embodiments, the first metal layer may be formed using the dummy via hole as a reflow guide.

In example embodiments, the first metal layer may completely fill the via hole and the dummy via hole, and may extend continuously on a sidewall and a bottom surface of the trench.

In example embodiments, the trench may be formed to connect the via hole to one end portion of the trench and connect the dummy via hole to another end portion of the trench.

In example embodiments, the lower structure may include a lower insulation layer and a lower wiring. The via hole may be formed to at least partially expose a top surface of the lower wiring, and the dummy via hole may be formed to expose only the lower insulation layer.

In example embodiments, the insulating interlayer may be partially removed to form a first via hole on one end portion of the trench and a second via hole on another end portion of the trench. The dummy via hole may be formed between the first via hole and the second via hole.

In example embodiments, the dummy via hole may extend at least partially through the lower insulation layer.

In example embodiments, an isolated dummy via hole may be further formed through the insulating interlayer. The isolated dummy via hole may be spaced apart from the trench.

In example embodiments, the first metal layer may fill the isolated dummy via hole.

According to example embodiments, there is provided a method of forming a wiring structure. In the method, a lower structure is formed on a substrate. An insulating interlayer is formed on the lower structure. The insulating interlayer is partially removed to form at least one via hole and an isolated dummy via hole. An upper portion of the insulating interlayer is partially removed to form at least one trench connected to the via hole. A first metal layer filling the via hole and the isolated dummy via hole is formed. A second metal layer filling the trench is formed on the first metal layer.

In example embodiments, the lower structure may include a first lower wiring and a second lower wiring. The insulating interlayer may be partially removed to form a first via hole exposing the first lower wiring and a second via hole exposing the second lower wiring. The upper portion of the insulating interlayer may be partially removed to form a first trench connected to the first via hole and a second trench connected to the second via hole. The insulating interlayer may be partially removed to form the isolated dummy via hole between the first trench and the second trench.

In example embodiments, the first metal layer may be formed by a reflow process, and the upper portion of the insulating interlayer may be partially removed to form the first trench and the second trench using the isolated dummy via hole as a common reflow guide.

In example embodiments, the insulating interlayer may be partially removed to form a first dummy via hole connected to the first via hole by the first trench, and a second dummy via hole connected to the second via hole by the second trench.

In example embodiments, the first metal layer may fill the first dummy via hole and the second dummy via hole.

In example embodiments, the first metal layer may commonly and continuously fill the first via hole, the second via hole, the first dummy via hole, the second dummy via hole and the isolated dummy via hole.

In example embodiments, the insulating interlayer may be partially removed to form the isolated dummy via hole at a center of a polygon defined by the first via hole, the second via hole, the first dummy via hole and the second dummy via hole.

In example embodiments, before forming the first metal layer, a liner layer commonly extending on inner walls of the via hole, the isolated dummy via hole and the trench may be formed. The liner layer may be formed of a CVD-Ru (Chemical Vapor Deposition-Ruthenium).

According to example embodiments, there is provided a method of manufacturing a semiconductor device. In the method, a plurality of semiconductor fins is formed on a substrate. A gate structure crossing the semiconductor fins is formed. Source/drain regions are formed on upper portions of the semiconductor fins adjacent to the gate structure. A contact electrically connected to at least one of the source/drain regions is formed. An insulating interlayer is formed on the gate structure, the source/drain regions and the contact. The insulating interlayer is partially removed to form a via hole superimposed on the contact and a dummy via hole not superimposed on the contact. A reflow metal layer at least partially filling the via hole and the dummy via hole is formed. A plated metal layer is formed on the reflow metal layer.

In example embodiments, a trench connecting the via hole and the dummy via hole may be formed. The reflow metal layer may partially fill the trench.

In example embodiments, the insulating interlayer may be partially removed to form an isolated dummy via hole. The reflow metal layer may fill the isolated dummy via hole.

In example embodiments, before forming the reflow metal layer, a CVD (Chemical Vapor Deposition) liner layer may be formed along inner walls of the via hole, the dummy via hole and the trench.

In example embodiments, in forming the plurality of the semiconductor fins, active patterns defined by an isolation layer may be formed on a substrate. An upper portion of the isolation layer may be removed such that the active patterns are exposed.

According to example embodiments, there is provided a wiring structure comprising first and second lower wirings on a substrate, first and second via structures electrically connected to the first and second lower wirings, respectively, at least one line structure integral with the first and second via structures, and at least one isolated dummy via structure between the first and second via structures.

In example embodiments, the first and second via structures and the isolated dummy via structures may include a same reflow metal.

In example embodiments, the first and second via structures and the isolated dummy via structures may include a ruthenium liner surrounding a lateral portion and a bottom surface of the reflow metal.

In example embodiments, the wiring structure may further include dummy via structures electrically connected to the line structure. The dummy via structures may be separate from the lower wirings.

According to example embodiments, there is provided a wiring structure comprising a lower wiring on a substrate, a single insulating interlayer covering the lower wiring, the single insulating interlayer including a via hole and a dummy via hole in a lower portion thereof and a trench in an upper portion thereof, the via hole and the dummy via hole connected to the trench, the dummy via hole spaced apart from the lower wiring, a liner pattern formed conformally on sidewalls and bottom surfaces of the via hole, the dummy via hole and the trench, and a metal pattern filling the via hole, the dummy via hole and the trench on the liner pattern.

In example embodiments, the single insulating interlayer may further include an isolated dummy via hole extending through the insulating interlayer and spaced apart from the trench. The liner pattern may be formed conformally on sidewalls and a bottom surface of the isolated dummy via hole, and the metal pattern may fill the isolated dummy via hole.

In example embodiments, the liner pattern may include ruthenium, and the metal pattern may include copper.

According to example embodiments, there is provided a method of forming a wiring structure comprising forming at least one lower wiring on a substrate, forming an insulating interlayer on the lower wiring, partially removing the insulating interlayer to form at least one via hole exposing the lower wiring and at least one dummy via hole separated from the lower wiring, partially removing an upper portion of the insulating interlayer to form a trench connecting the via hole and the dummy via hole, forming at least one via structure filling the via hole and the dummy via hole by a reflow process, and forming a line structure on the via structure.

In example embodiments, the line structure may be formed by a plating process using the via structure as a seed, and the at least one via structure may be formed using the dummy via hole as a reflow guide.

BRIEF DESCRIPTION OF THE DRAWINGS

Example embodiments will be more clearly understood from the following detailed description taken in conjunction with the accompanying drawings.

FIGS. 1 and 2 are cross-sectional view and a top plan view, respectively, illustrating a wiring structure in accordance with example embodiments;

FIGS. 47 to 52 are perspective views and cross-sectional views illustrating a method of manufacturing a semiconductor device in accordance with example embodiments.

DETAILED DESCRIPTION

Figure 1:
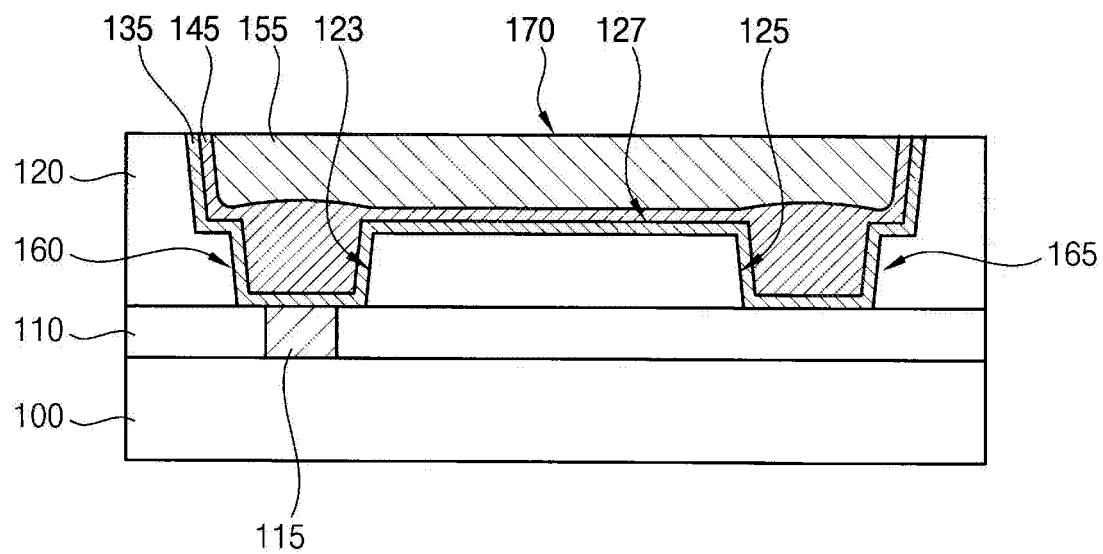
FIGS. 1 to 52 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
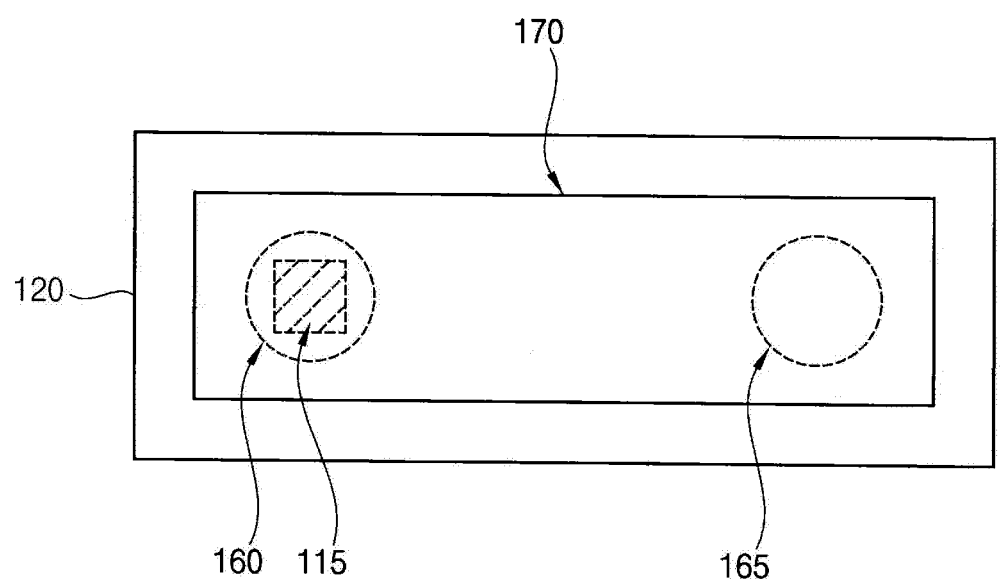

FIGS. 1 and 2 are cross-sectional view and a top plan view, respectively, illustrating a wiring structure in accordance with example embodiments.

Referring to FIGS. 1 and 2, the wiring structure may include a via structure 160 and a dummy via structure 165 which may be formed in an insulating interlayer 120, and may include a line structure 170 connected to the via structure 160 and the dummy via structure 165.

The insulating interlayer 120 and the wiring structure may be disposed on a lower structure formed on a substrate 100. The lower structure may include a lower insulation layer 110 and a lower wiring 115.

The substrate 100 may include a semiconductor substrate, e.g., a silicon substrate, a germanium substrate or a silicon-germanium substrate. A silicon-on-insulator (SOI) substrate or a germanium-on-insulator (GOI) substrate may be also used as the substrate 100. The substrate 100 may include a Group III-V compound, e.g., InP, GaP, GaAs, or GaSb. The substrate 100 may further include p-type and/or n-type wells.

A circuit device (not illustrated), e.g., a gate structure, an impurity region, a contact, or a plug, may be further formed on the substrate 100.

The lower insulation layer 110 may be formed on the substrate 100$n$ and may cover the circuit device. The lower insulation layer 110 may include an insulation material, e.g., silicon oxide or silicon oxynitride. For example, the lower insulation layer 110 may include an oxide-based material, e.g., plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), or boro phospho silicate glass (BPSG).

The lower wiring 115 may be included in the lower insulation layer 110 to be electrically connected to the circuit device. The lower wiring 115 may include a conductive material, e.g., a metal, a metal nitride, a metal silicide or doped polysilicon. The lower wiring 115 may serve as a pad or a contact.

The insulating interlayer 120 may be formed on the lower insulation layer 110, and a via hole 123, a dummy via hole 125 and a trench 127 may be formed in the insulating interlayer 120. The trench 127 may be connected to upper portions of the via hole 123 and the dummy via hole 125. The trench 127, the via hole 123 and the dummy via hole 125 may be integrally connected to each other. The insulating interlayer 120 may include, e.g., the above-mentioned oxide or silicon oxynitride.

In example embodiments, a top surface of the lower wiring 115 may be at least partially exposed through the via hole 123. In example embodiments, the top surface of the lower wiring 115 may be entirely exposed through the via hole 123, and a portion of a top surface of the lower insulation layer 110 may be also exposed through the via hole 123.

In example embodiments, the lower wiring 115 may not be exposed by the dummy via hole 125. For example, the top surface of the lower insulation layer 110 may be only exposed through the dummy via hole 125.

The wiring structure may include a liner pattern 135, a first metal pattern 145 and a second metal pattern 155 filled in the trench 127, the via hole 123 and the dummy via hole 125.

The liner pattern 135 may be formed along sidewalls and bottom surfaces of the trench 127, the via hole 123 and the dummy via hole 125. The liner pattern 135 may have a substantially uniform thickness throughout the bottom surfaces and the sidewalls.

In example embodiments, the liner pattern 135 may include a CVD-Ru (Chemical Vapor Deposition-Ruthenium).

The first metal pattern 145 may be formed on the liner pattern 135 to fill the via hole 123 and the dummy via hole 125. In example embodiments, the first metal pattern 145 may substantially fully fill the via hole 123 and the dummy via hole 125, and may extend on a sidewall and a bottom surface of the trench 127.

In example embodiments, as illustrated in FIG. 1, the first metal pattern 145 may continuously extend from one sidewall of the trench 127 and the other sidewall of the trench 127 filling the via hole 123 and the dummy via hole 125.

In example embodiments, the first metal pattern 145 may include a reflow metal.

The second metal pattern 155 may be formed on the first metal pattern 145, and may fill the trench 127. For example, the second metal pattern 155 may fill a remaining portion of the trench 127 which may not be filled with the first metal pattern 145.

In example embodiments, the second metal pattern 155 may include a metal of substantially the same species as that of the first metal pattern 145. For example, the second metal pattern 155 may include a plated copper (Cu).

Portions of the liner pattern 135, the first metal pattern 145 and the second metal pattern 155 formed in the via hole 123 may be defined as the via structure 160. In example embodiments, the via structure 160 may be defined only by the liner pattern 135 and the first metal pattern 145. The via structure 160 may be in contact with the lower wiring 115.

Portions of the liner pattern 135, the first metal pattern 145 and the second metal pattern 155 formed in the dummy via hole 125 may be defined as the dummy via structure 165. In example embodiments, the dummy via structure 165 may be defined only by the liner pattern 135 and the first metal pattern 145. The dummy via structure 165 may not be in contact with a conductive pattern, e.g., the lower wiring 115. For example, the dummy via structure 165 may be in contact with the top surface of the lower insulation layer 110.

Portions of the liner pattern 135, the first metal pattern 145 and the second metal pattern 155 formed in the trench 127 may be defined as the line structure 170. The line structure 170 may be embedded in an upper portion of the insulating interlayer 120, and may be integrally connected to the via structure 160 and the dummy via structure 165.

Accordingly, the line structure 170, the via structure 160 and the dummy via structure 165 may serve as the wiring structure of a substantially single unitary member.

The wiring structure may serve as an interconnection structure formed by, e.g., a back-end-of-line (BEOL) process in a fabrication of a semiconductor device.

According to example embodiments, the wiring structure may include the dummy via structure 165. The dummy via structure 165 may function as a guiding pattern for the formation of the first metal pattern 145 without interfering an electrical signaling. Thus, the second metal pattern 155 having few or no defects (e.g., a void or a seam) may be obtained.

FIGS. 3 to 9 are cross-sectional views illustrating a method of forming a wiring structure in accordance with example embodiments. For example, FIGS. 3 to 9 are cross-sectional views illustrating the wiring structure of FIGS. 1 and 2.

Figure 3:
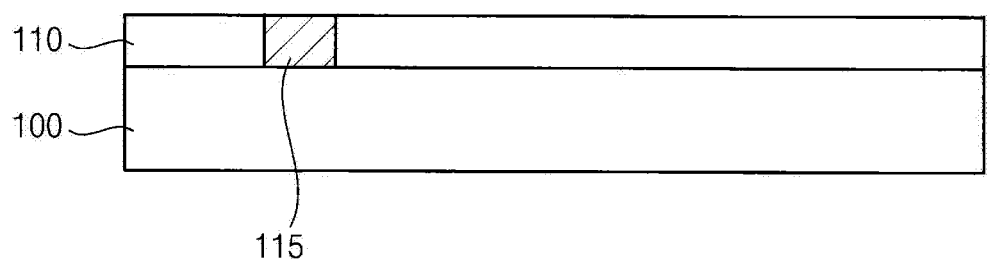
FIGS. 3 to 9 are cross-sectional views illustrating a method of forming a wiring structure in accordance with example embodiments.

Referring to FIG. 3, a lower structure including a lower insulation layer 110 and a lower wiring 115 may be formed on a substrate 100.

The substrate 100 may include a semiconductor substrate, e.g., a silicon substrate, a germanium substrate or a silicon-germanium substrate, an SOI substrate, or a GOI substrate. The substrate 100 may include a Group III-V compound, e.g., InP, GaP, GaAs, or GaSb. The substrate 100 may further include p-type and/or n-type wells.

A circuit device including, e.g., a gate structure, an impurity region, a contact and/or a plug, may be formed on the substrate 100.

The lower insulation layer 110 may be formed on the substrate 100 to cover the circuit device. The lower insulation layer 110 may be formed of, e.g., the above-mentioned oxide-based material or silicon oxynitride.

The lower insulation layer 110 may be formed by at least one of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process and an atomic layer deposition (ALD) process.

In example embodiments, an etch-stop layer including, e.g., silicon nitride may be further formed on the lower insulation layer 110.

In example embodiments, the lower insulation layer 110 may be partially etched to form an opening, e.g., a hole or a trench, and a conductive layer filling the opening may be formed by a deposition process or a plating process. An upper portion of the conductive layer may be planarized by, e.g., a chemical mechanical polish (CMP) process to form the lower wiring 115. The lower wiring 115 may be electrically connected to the circuit device formed on the substrate 100.

Figure 4:
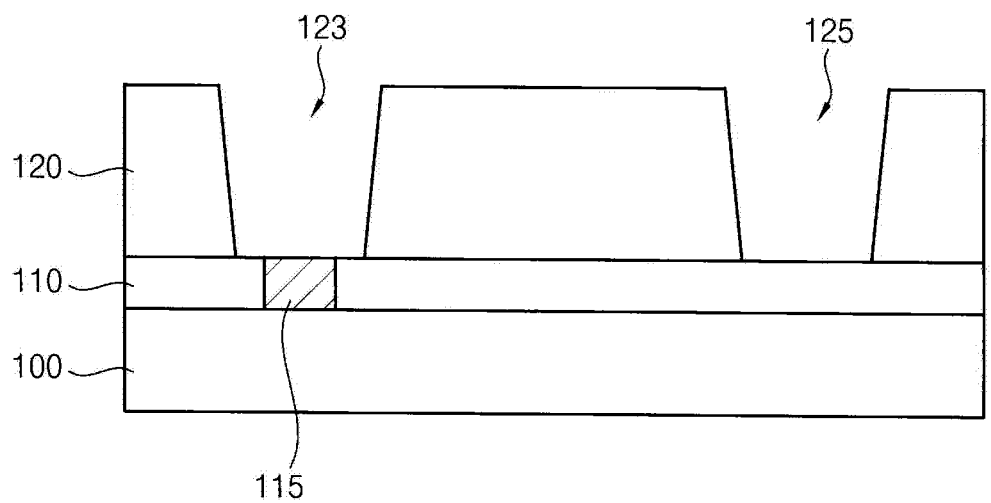

Referring to FIG. 4, an insulating interlayer 120 including a via hole 123 and a dummy via hole 125 may be formed on the lower structure.

In example embodiments, a photoresist layer may be formed on the insulating interlayer 120, and the photoresist later may be partially removed by exposure and developing processes to form a photoresist pattern through which a top surface of the insulating interlayer 120 is partially exposed. The insulating interlayer 120 may be partially etched using the photoresist pattern as a mask to form the via hole 123 and the dummy via hole 125. As described above, the via hole 123 and the dummy via hole 125 may be formed from a substantially single etching process using the same etching mask.

A top surface of the lower wiring 115 may be at least partially exposed through the via hole 123. In example embodiments, the top surface of the lower wiring 115 may be entirely exposed through the via hole 123, and a top surface of the lower insulation layer 110 around the lower wiring 115 may be also exposed through the via hole 123.

A region of the lower insulation layer 110 at which the lower wiring 115 is not formed may be exposed through the dummy via hole 125. For example, the top surface of the lower insulation layer 110 may be only exposed through the dummy via hole 125.

The insulating interlayer 120 may be formed of the above-mentioned oxide-based material or silicon oxynitride by, e.g., a CVD process or a spin coating process. The photoresist pattern may be removed by an ashing process and/or a strip process after the formation of the via hole 123 and the dummy via hole 125.

Figure 5:
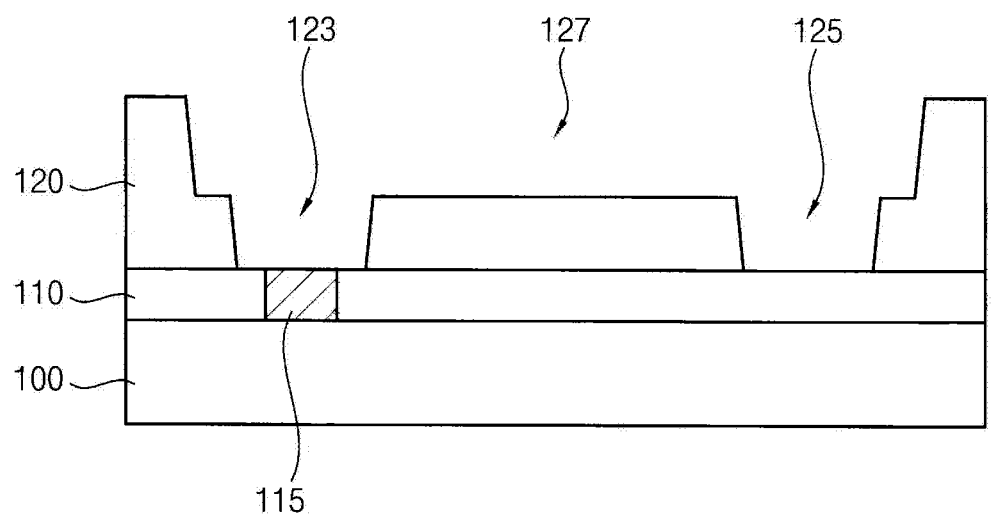

Referring to FIG. 5, an upper portion of the insulating interlayer 120 may be partially removed to form a trench 127 connected to the via hole 123 and the dummy via hole 125.

For example, the trench 127 may embrace upper portions of the via hole 123 and the dummy via hole 125, and may extend linearly. The via hole 123 and the dummy via hole 125 may be in a fluid communication with each other via the trench 127.

Accordingly, an opening including the via hole 123, the dummy via hole 125 and the trench 127 for the formation of the wiring structure may be formed by a dual damascene process.

Figure 6:
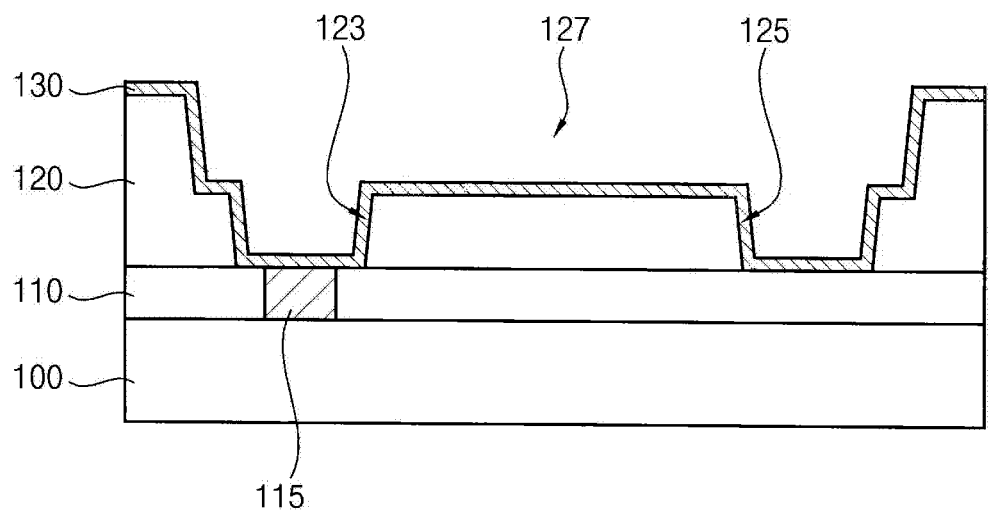

Referring to FIG. 6, a liner layer 130 may be formed along a top surface of the insulating interlayer 120, and bottom surfaces and sidewalls of the via hole 123, the dummy via hole 125 and the trench 127.

In example embodiments, the liner layer 130 may be formed by a CVD process using a metal precursor. If the wiring structure is formed in a BEOL process for fabricating a relatively highly integrated semiconductor device, the via hole 123 and the trench 127 may have a fine critical dimension. For example, when the critical dimension is reduced to a level of about 10 nm, the liner layer 130 having a uniform profile on the bottom surfaces and sidewalls of the via hole 123 and the trench 127 may not be obtained by a PVD process, e.g., a sputtering process or an ALD process, because vertical deposition properties are prevalent in the PVD process and the ALD process.

Therefore, the liner layer 130 may be formed by a CVD process having relatively desirable step coverage and lateral deposition properties.

The liner layer 130 may be formed using a ruthenium (Ru) precursor, e.g., ruthenium carbonyl. Thus, the liner layer 130 may include a CVD-Ru. Ru has a CVD deposition affinity greater than those of other metals, e.g., titanium (Ti) or tantalum (Ta). Additionally, Ru has an alloy-formation property less than that of, e.g., cobalt (Co).

Thus, the liner layer 130 having a uniform profile along the bottom surfaces and the sidewalls of the via hole 123, the dummy via hole 125 and the trench 127 may be obtained from the CVD-Ru, and an alloy-formation of the liner layer 130 with a metal layer that may be subsequently formed may be avoided.

The liner layer 130 may function as a barrier for blocking a metal diffusion into the insulating interlayer while forming the metal layer. The liner layer 130 may also provide an adhesion for the formation of the metal layer.

In example embodiments, an annealing treatment may be performed on the liner layer 130. For example, the annealing treatment may be performed in an individual annealing chamber of an inert gas atmosphere. In an embodiment, the annealing treatment may be performed in the annealing chamber of hydrogen ($H_2$) atmosphere. Accordingly, carbon-based impurities, e.g., carbonyl groups, remaining on a surface of the liner layer 130 may be removed so that a surface property of the liner layer 130 may be improved.

Figure 7:
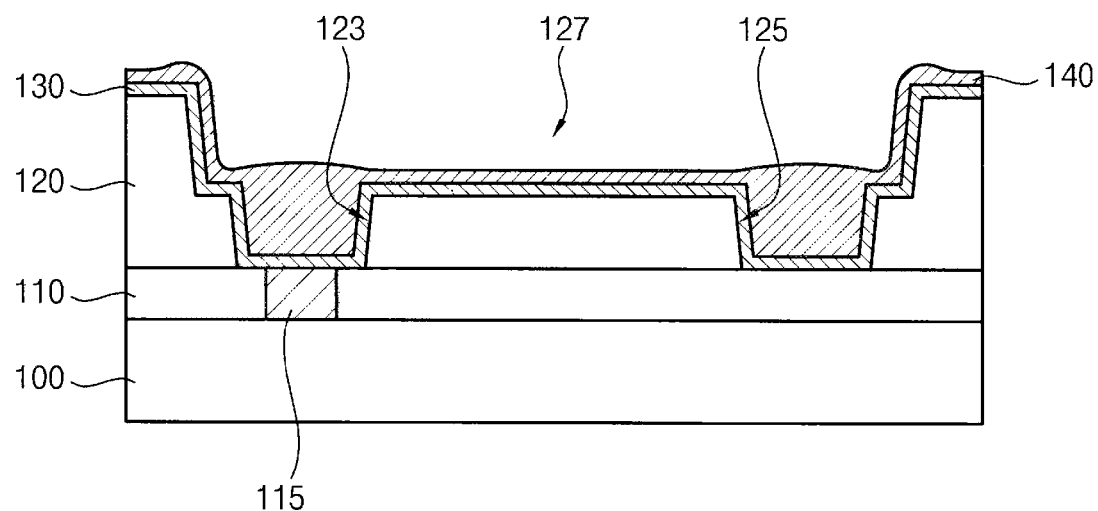

Referring to FIG. 7, a first metal layer 140 filling the via hole 123 and the dummy via hole 125 may be formed on the liner layer 130.

In example embodiments, the first metal layer 140 may be formed by a reflow process. For example, the reflow process may be performed using a copper target, and thus the first metal layer 140 may include a reflow copper.

In the reflow process, the via hole 123 and the dummy via hole 125 may serve as a reflow guide. Thus, copper may be deposited from the via hole 123 and the dummy via hole 125.

In example embodiments, the first metal layer 140 may substantially fully fill the via hole 123 and the dummy via hole 125, and extend on the sidewall and the bottom surface of the trench 127. As illustrated in FIG. 7, the dummy via hole 125 may be added at one end portion of the trench 127 so that the first metal layer 140 may be continuously formed throughout the bottom surface of the trench 127. Thus, the first metal layer 140 may extend continuously on the liner layer 130.

Figure 8:
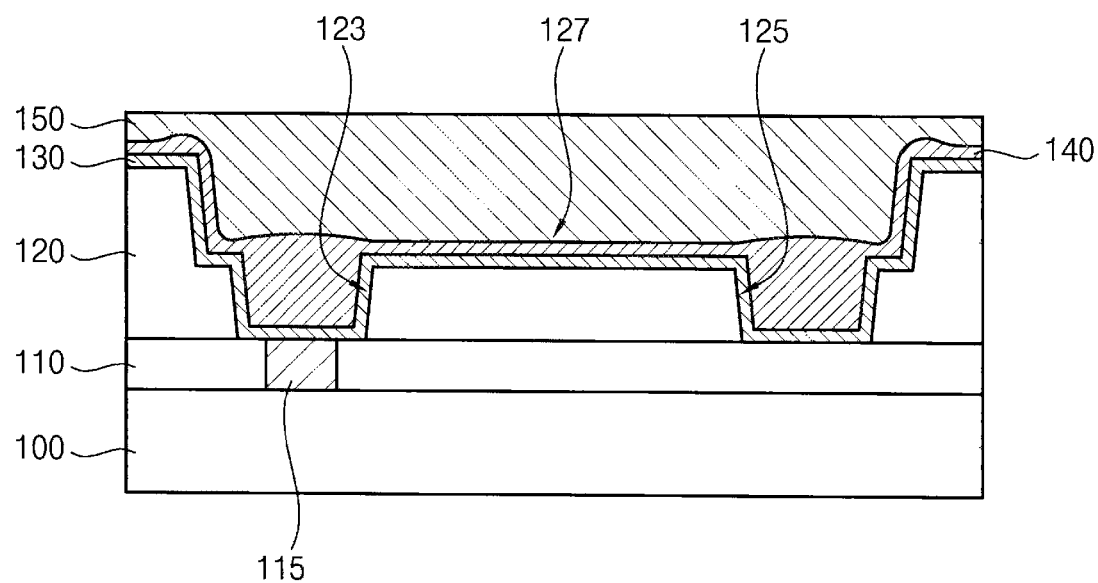

Referring to FIG. 8, a second metal layer 150 filling a remaining portion of the trench 127 may be formed on the first metal layer 140.

In example embodiments, the second metal layer 150 may be formed by a plating process using the first metal layer 140 as a seed layer. In example embodiments, the second metal layer 150 may be formed by a Cu electroplating process.

For example, the substrate 100 including the first metal layer 140 may be immersed in a plating solution, e.g., a copper sulfate solution, and a current may be applied using the first metal layer 140 and the plating solution as a cathode and an anode, respectively. Accordingly, the second metal layer 150 including copper may be grown or precipitated from the first metal layer 140 through an electrochemical reaction.

As described above, the reflow copper may be guided by the via hole 123 and the dummy via hole 125, and thus the first metal layer 140 may sufficiently fill the via hole 123 and the dummy via hole 125. Accordingly, the first metal layer 140 may extend continuously on the bottom surface of the trench 127, and a sufficient seed for the formation of the second metal layer 150 may be provided. Therefore, the second metal layer 150 having few or no vacancies, e.g., a void or a seam therein, may be formed in the trench 127.

Figure 9:
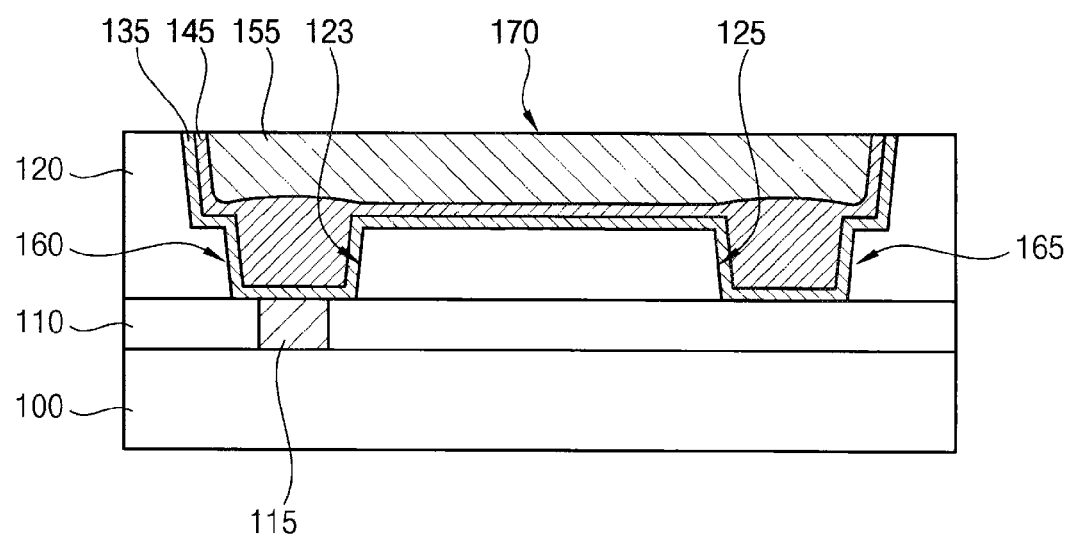

Referring to FIG. 9, upper portions of the liner layer 130, the first metal layer 140 and the second metal layer 150 may be planarized by a CMP process and/or an etch-back process until the top surface of the insulating interlayer 120 is exposed.

Accordingly, a wiring structure including a liner pattern 135, a first metal pattern 145 and a second metal pattern 155 sequentially stacked on the sidewalls and the bottom surfaces of the via hole 123, the dummy via hole 125 and the trench 127 may be formed.

A portion of the wiring structure formed in the via hole 123 may be defined as a via structure 160. A portion of the wiring structure formed in the dummy via hole 125 may be defined as a dummy via structure 165. A portion of the wiring structure formed in the trench 127 may be defined as a line structure 170.

The via structure 160 and the dummy via structure 165 may be connected to each other via the line structure 170. The via structure 160 may be in contact with or electrically connected to the lower wiring 115 to provide an interconnection. The dummy via structure 165 may be landed on the lower insulation layer 110, and may serve as a reflow guide pattern.

The wiring structure may be free of defects, e.g., the void and the seam therein, and may substantially fully fill the via hole 123, the dummy via hole 125 and the trench 127.

Figure 10:
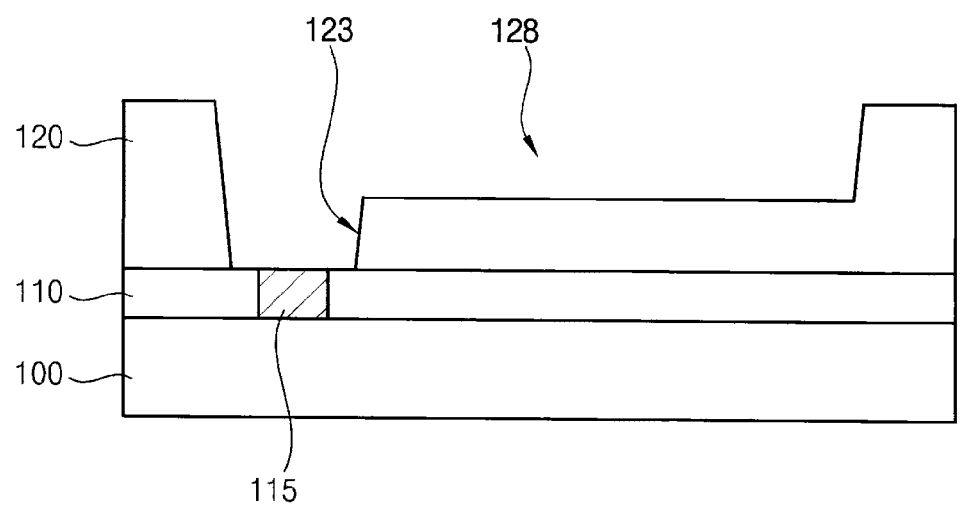
FIGS. 10 to 12 are cross-sectional views illustrating a method of forming a wiring structure in accordance with a comparative example.
Figure 11:
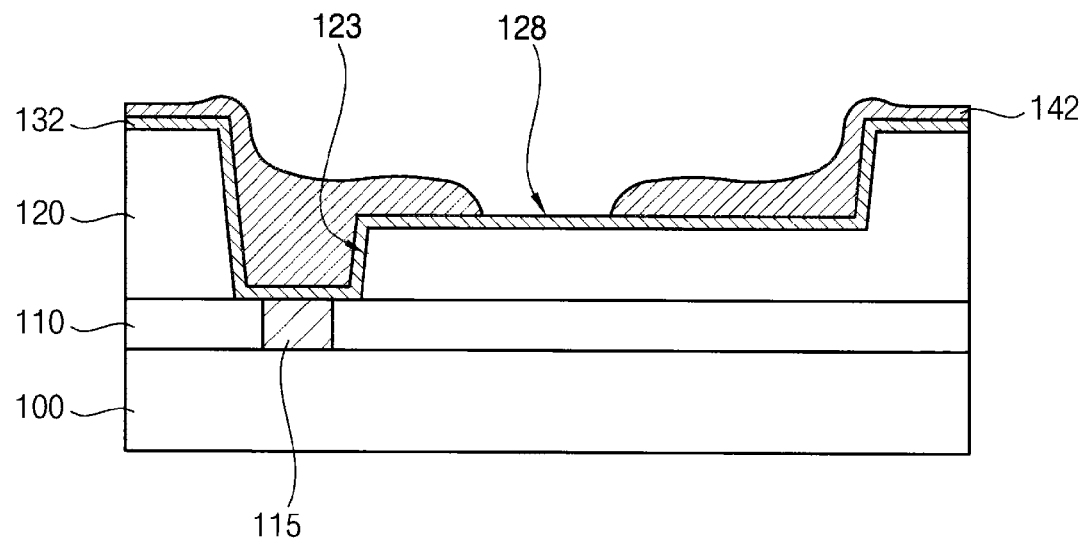
Figure 12:
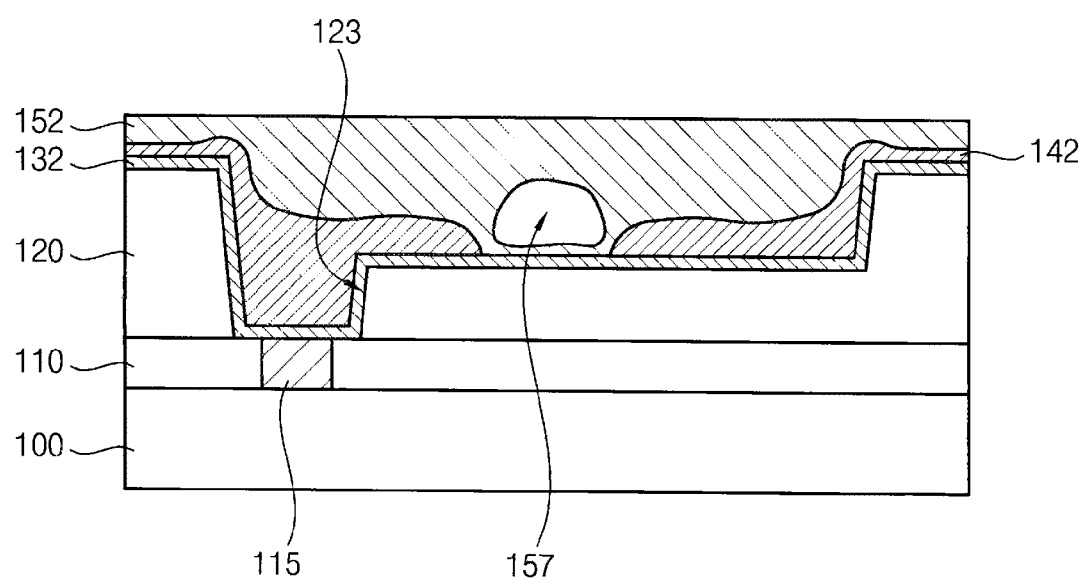

FIGS. 10 to 12 are cross-sectional views illustrating a method of forming a wiring structure in accordance with a comparative example. Detailed descriptions on processes and materials substantially the same as or similar to those illustrated with reference to FIGS. 3 to 9 are omitted.

Referring to FIG. 10, a lower structure including a lower insulation layer 110 and a lower wiring 115 may be formed on a substrate 100, and an insulating interlayer 120 may be formed on the lower structure as illustrated in FIG. 3.

The insulating interlayer 120 may be partially etched to form a via hole 123 through which the lower wiring 115 is exposed, and an upper portion of the insulating interlayer 120 may be additionally removed to form a trench 128 connected to the via hole 123.

Referring to FIG. 11, a liner layer 132 may be formed along a top surface of an insulating interlayer 120, and sidewalls and bottom surfaces of the via hole 123 and the trench 128. As described with reference to FIG. 6, the liner layer 132 may be formed of a CVD-Ru. Subsequently, a first metal layer 142 may be formed on the liner layer 132 by a Cu reflow process.

According to the comparative example, the first metal layer 142 may be reflowed into the via hole 123 in advance, and then may extend on the sidewall and the bottom surface of the trench 128. Thus, as a distance from the via hole 123 increases, a site at which the first metal layer 142 is not formed may be created. For example, as illustrated in FIG. 11, the first metal layer 142 may include a vacancy at a central portion of the bottom surface of the trench 128.

Referring to FIG. 12, a second metal layer 152 may be formed from a plating process using the first metal layer 142 as a seed.

According to the comparative example, the plating process may not be sufficiently performed due to the vacancy that may not include the first metal layer 142. As a result, a void 157 may be generated in the second metal layer 152.

However, according to example embodiments as described above, the dummy via hole 125 may be connected to, e.g., an opposite portion of the trench 127 with respect to the via hole 123. Thus, the first metal layer 140 may be guided by both the via hole 123 and the dummy via hole 125 to sufficiently provide a plating seed throughout the bottom surface of the trench 127. Thus, the wiring structure having few or no defects, for example, the void 157 as illustrated in FIG. 12, may be formed, FIGS. 13 and 14 are cross-sectional view and a top plan view, respectively, illustrating a wiring structure in accordance with example embodiments.

Figure 13:
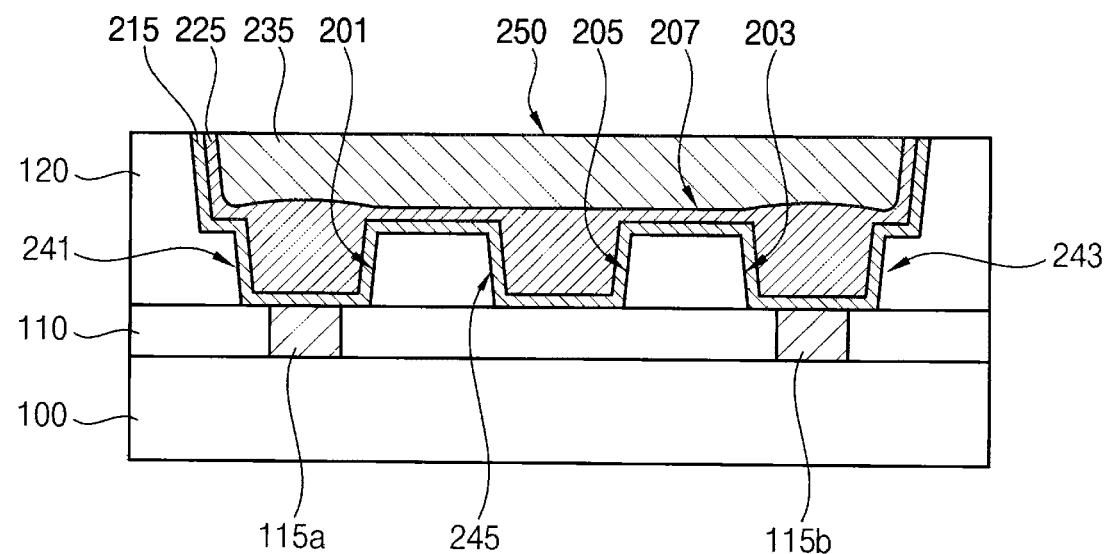
FIGS. 13 and 14 are cross-sectional view and a top plan view, respectively, illustrating a wiring structure in accordance with example embodiments.
Figure 14:
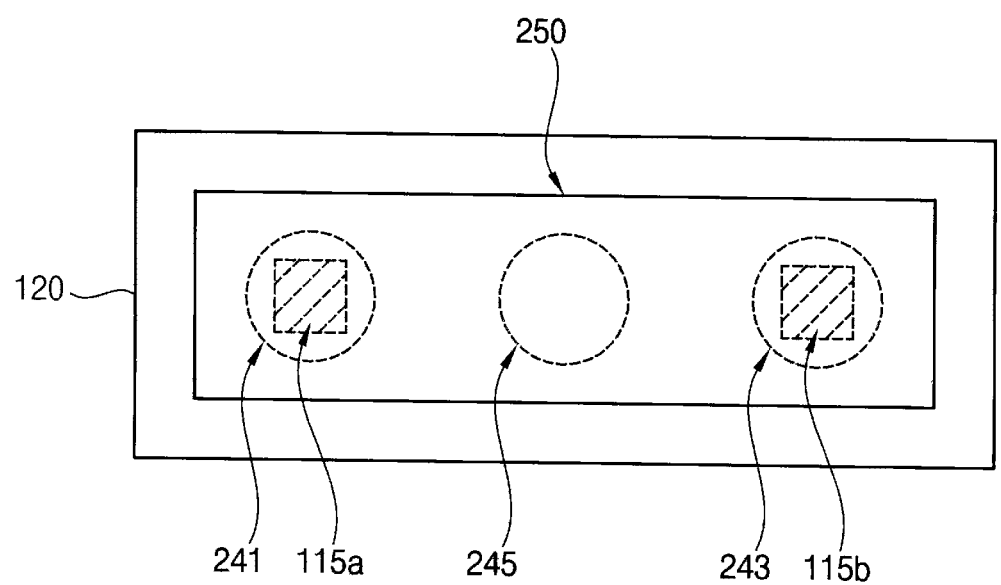

The wiring structure of FIGS. 13 and 14 may have elements and/or constructions substantially the same as or similar to those of the wiring structure illustrated in FIGS. 1 and 2 except for an arrangement of a via hole and a dummy via hole. Thus, detailed descriptions on repeated elements and/or structures are omitted herein.

Referring to FIGS. 13 and 14, the wiring structure may include a first via structure 241, a second via structure 243 and a dummy via structure 245 in an insulating interlayer 120, and may include a line structure 250 connected to the first via structure 241, the second via structure 243 and the dummy via structure 245 in an upper portion of the insulating interlayer 120.

The first via structure 241 and the second via structure 243 may be electrically connected to a first lower wiring 115a and a second lower wiring 115b, respectively, formed in a lower insulation layer 110. The dummy via structure 245 may not be electrically connected to the lower wirings 115a and 115b, and may be in contact with a top surface of the lower insulation layer 110.

In example embodiments, the first via structure 241 and the second via structure 243 may be disposed at both end portions of the line structure 250, and may be integral with the line structure 250. The dummy via structure 245 may be interposed between the first via structure 241 and the second via structure 243. For example, the dummy via structure 245 may be integral with a central portion of the line structure 250.

A first via hole 201 and a second via hole 203 exposing the first lower wiring 115a and the second lower wiring 115b, respectively, may be formed in the insulating interlayer 120. A dummy via hole 205 may be formed between the first via hole 201 and the second via hole 203, and a top surface of the lower insulation layer 110 may be exposed therethrough. A trench 207 may be formed at the upper portion of the insulating interlayer 120 to be connected to the first via hole 201, the second via hole 203 and the dummy via hole 205.

A liner pattern 215, a first metal pattern 225 and a second metal pattern 235 may be sequentially stacked on sidewalls and bottom surfaces of the trench 207, the first via hole 201, the second via hole 203 and the dummy via hole 205.

In example embodiments, the first metal pattern 225 may sufficiently fill the first via hole 201, the second via hole 203 and the dummy via hole 205 on the liner pattern 215, and may extend on a sidewall and a bottom surface of the trench 207.

Accordingly, the first via structure 241, the second via structure 243 and the dummy via structure 245 may be defined by portions of the liner pattern 215 and the first metal pattern 225 formed in the first via hole 201, the second via hole 203 and the dummy via hole 205, respectively.

The second metal pattern 235 may fill a remaining portion of the trench 207 on the first metal pattern 225. The line structure 250 may be defined by portions of the liner pattern 215, the first metal pattern 225 and the second metal pattern 235 formed in the trench 207.

According to example embodiments as described above, a position or a location of the dummy via structure 245 may be properly adjusted in the wiring structure including a plurality of the via structures to provide a guide pattern for the formation of the first metal pattern 225.

FIGS. 15 to 19 are cross-sectional views illustrating a method of forming a wiring structure in accordance with example embodiments. For example, FIGS. 15 to 19 are cross-sectional views illustrating a method of forming the wiring structure of FIGS. 13 and 14.

Detailed descriptions on processes and/or materials substantially the same as or similar to those illustrated with reference to FIGS. 3 to 9 are omitted herein.

Figure 15:
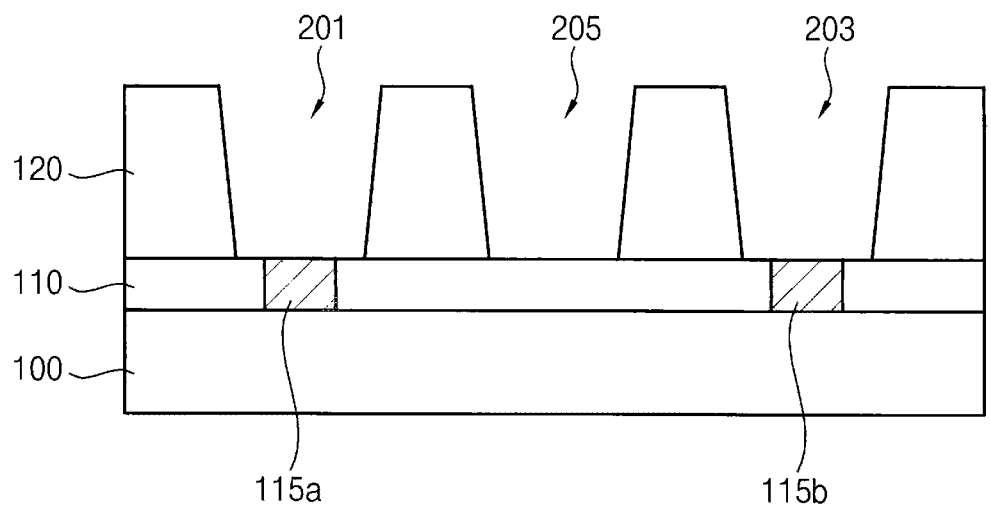
FIGS. 15 to 19 are cross-sectional views illustrating a method of forming a wiring structure in accordance with example embodiments.

Referring to FIG. 15, a process substantially the same as or similar to that illustrated with reference to FIG. 3 may be performed to form a lower insulation layer 110 and a lower wiring on a substrate 100. The lower wiring may include a first lower wiring 115a and a second lower wiring 115b. In example embodiments, the first and second lower wirings 115a and 115b may serve as pads separated from each other.

An insulating interlayer 120 covering the lower insulation layer 110 and the lower wirings 115a and 115b may be formed. A process substantially the same as or similar to that illustrated with reference to FIG. 4 may be performed to form a first via hole 201, a second via hole 203 and a dummy via hole 205.

The first via hole 201 and the second via hole 203 may be formed to expose the first lower wiring 115a and the second lower wiring 115b, respectively. In example embodiments, the dummy via hole 205 may be formed between the first via hole 201 and the second via hole 203 to expose a top surface of the lower insulation layer 110.

Figure 16:
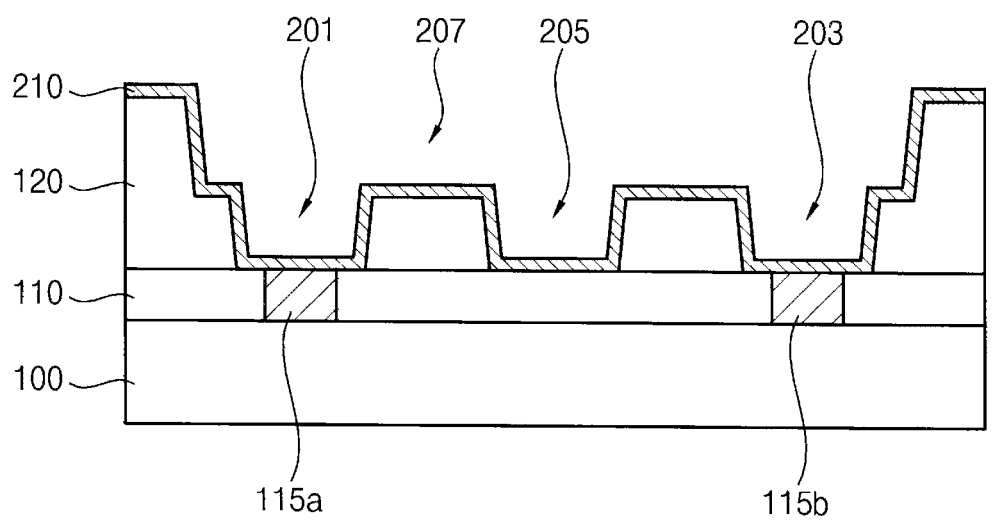

Referring to FIG. 16, a process substantially the same as or similar to that illustrated with reference to FIG. 5 may be performed to form a trench 207. The trench 207 may extend linearly and embrace the first via hole 201, the second via hole 203 and the dummy via hole 205. For example, the dummy via hole 205 may be connected to a substantially central portion of the trench 207.

A process substantially the same as or similar to that illustrated with reference to FIG. 6 may be performed to form a liner layer 210. For example, the liner layer 210 may be formed of a CVD-Ru.

The liner layer 210 may be formed along a top surface of the insulating interlayer 120, and sidewalls and bottom surfaces of the first via hole 210, the second via hole 203, the dummy via hole 205 and the trench 207 with a substantially uniform thickness.

Figure 17:
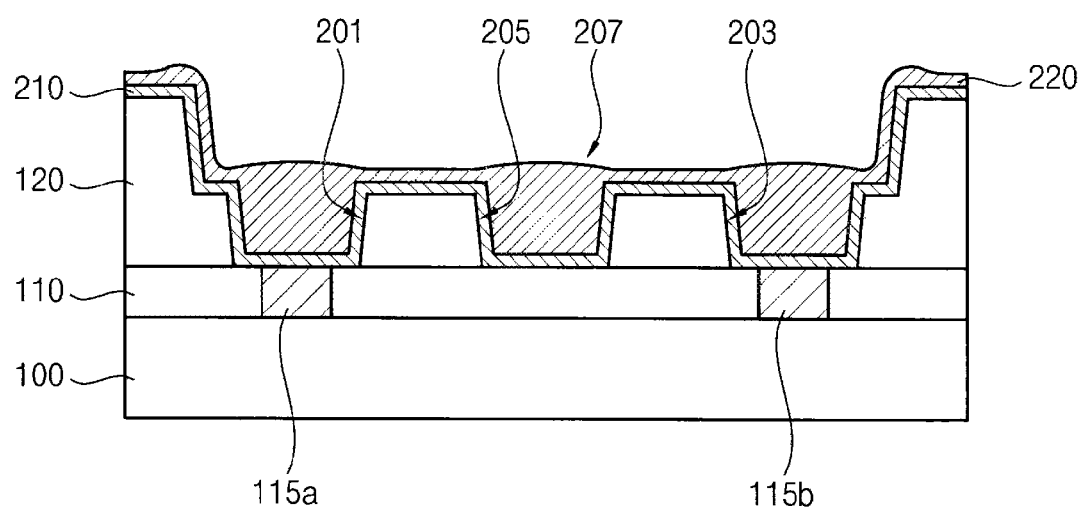

Referring to FIG. 17, a process substantially the same as or similar to that illustrated with reference to FIG. 7 may be performed to form a first metal layer 220 on the liner layer 210. For example, the first metal layer 220 may be formed by a Cu reflow process.

In example embodiments, the dummy via hole 205 may function as a reflow guide between the first and second via holes 201 and 203. Thus, the first metal layer 220 may be continuously formed even though the trench 207 has a relatively large length, and thus a sufficient seed for a subsequent plating process may be achieved.

In example embodiments, the first metal layer 220 may sufficiently fill the first and second via holes 201 and 203, and the dummy via hole 205 to extend on the sidewall and the bottom surface of the trench 207.

Figure 18:
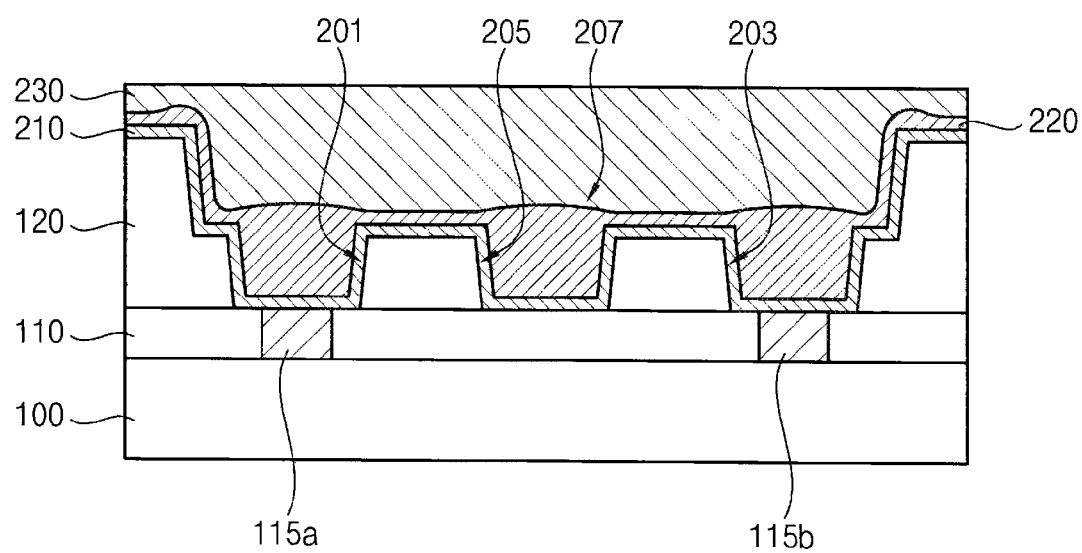

Referring to FIG. 18, a process substantially the same as or similar to that illustrated with reference to FIG. 8 may be performed to form a second metal layer 230 filling a remaining portion of the trench 207 on the first metal layer 220. The second metal layer 230 may be formed by, e.g., a Cu plating process.

Figure 19:
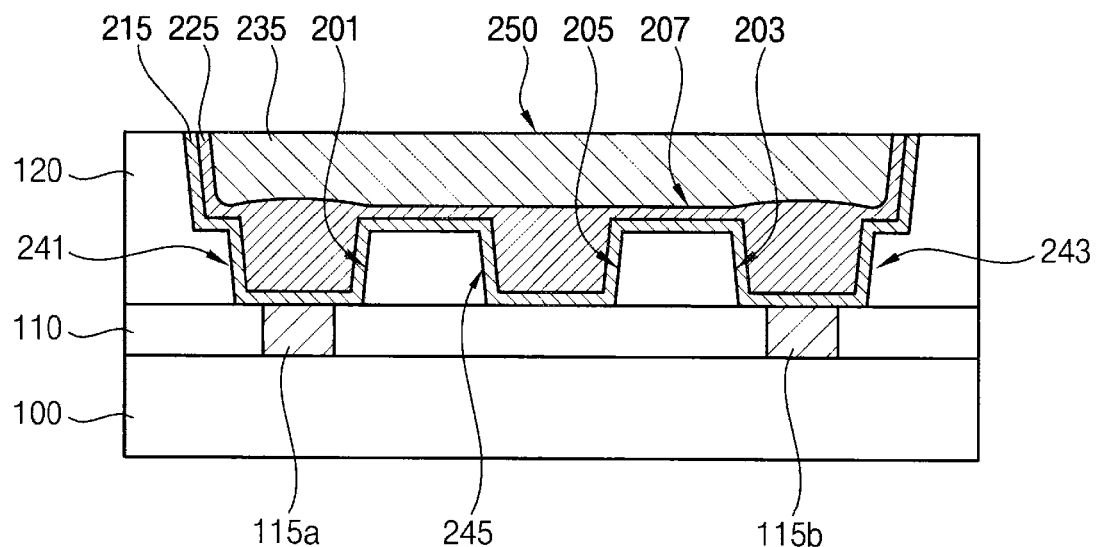

Referring to FIG. 19, as illustrated with reference to FIG. 8, upper portions of the second metal layer 230, the first metal layer 220 and the liner layer 210 may be planarized to form a wiring structure including a liner pattern 215, a first metal pattern 225 and a second metal pattern 235 sequentially stacked.

In example embodiments, a first via structure 241, a second via structure 243 and a dummy via structure 245 may be defined by portions of the liner pattern 215 and the first metal pattern 225 formed in the first via hole 201, the second via hole 203 and the dummy via hole 205, respectively. A line structure 250 may be defined by portions of the liner pattern 215, the first metal pattern 225 and the second metal pattern 235 formed in the trench 250.

Accordingly. the wiring structure including the first via structure 241, the second via structure 243, the dummy via structure 245 and the line structure 250 integrally connected to each other may be obtained.

Figure 20:
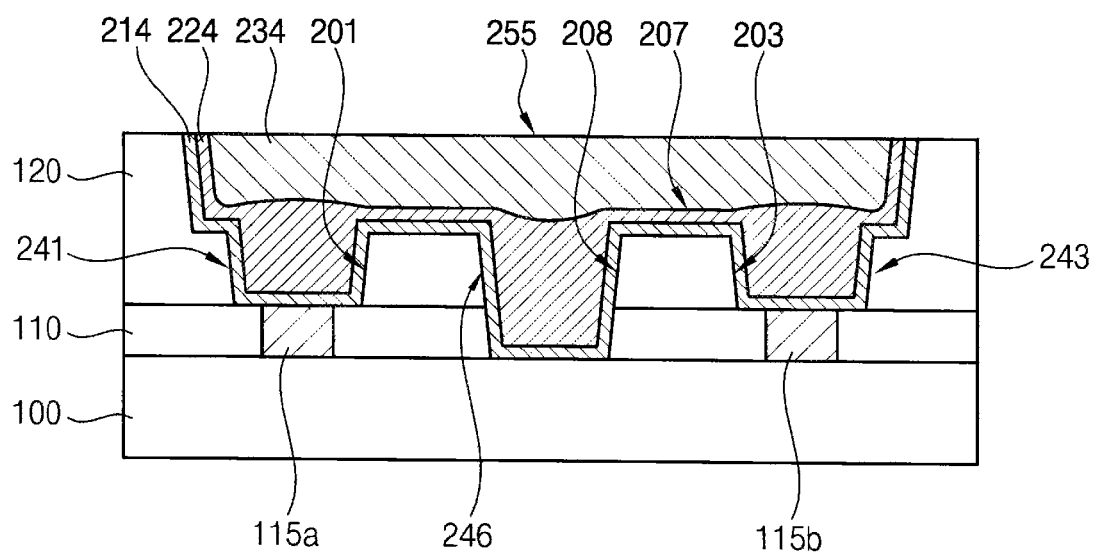
FIG. 20 is a cross-sectional view illustrating a wiring structure in accordance with some example embodiments.

FIG. 20 is a cross-sectional view illustrating a wiring structure in accordance with some example embodiments. The wiring structure of FIG. 20 may have elements and/or constructions substantially the same as or similar to those of the wiring structure illustrated in FIGS. 13 and 14 except for a construction of a dummy via structure. Thus, detailed descriptions on repeated elements and/or structures are omitted herein, and like reference numerals are used to designate like elements.

Referring to FIG. 20, the wiring structure may include a first via structure 241, a second via structure 243 and a dummy via structure 246, and may include a line structure 255 integral with the first via structure 241, the second via structure 243 and the dummy via structure 246.

The first via structure 241, the second via structure 243 and the dummy via structure 246 may be defined by portions of a liner pattern 214 and a first metal pattern 224 formed in a first via hole 201, a second via hole 203 and a dummy via hole 208, respectively. The line structure 255 may be defined as portions of the liner pattern 214, the first metal pattern 224 and the second metal pattern 234 formed in a trench 209.

In example embodiments, the dummy via structure 246 may have a length greater than those of the first and second via structures 241 and 243. For example, as illustrated in FIG. 20, the dummy via hole 205 may extend at least partially through a lower insulation layer 110. Thus, the dummy via structure 246 may be at least partially buried in the lower insulation layer 110.

FIGS. 21 to 24 are cross-sectional views illustrating a method of forming a wiring structure in accordance with some example embodiments. For example, FIGS. 21 to 24 are cross-sectional views illustrating a method of forming the wiring structure of FIG. 20.

Detailed descriptions on processes substantially the same as or similar to those illustrated with reference to FIGS. 3 to 9, or FIGS. 15 to 19 are omitted herein.

Figure 21:
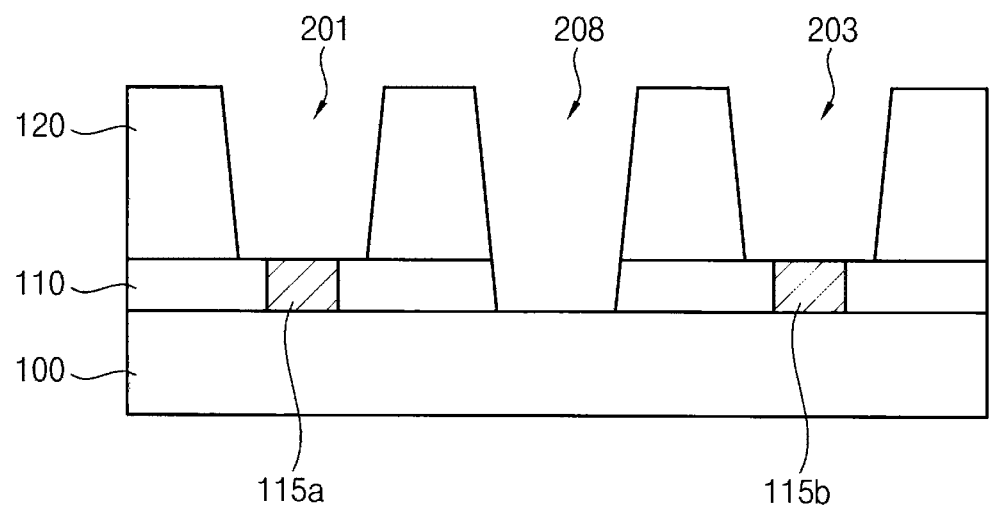
FIGS. 21 to 24 are cross-sectional views illustrating a method of forming a wiring structure in accordance with some example embodiments.

Referring to FIG. 21, a process substantially the same as or similar to that illustrated with reference to FIG. 15 may be performed.

Accordingly, a lower structure including a lower insulation layer 110, a first lower wiring 115a and a second lower wiring 115b may be formed on a substrate 100, and an insulating interlayer 120 covering the lower structure may be formed. The insulating interlayer 120 may be partially removed to form a first via hole 201, a second via hole 203 and a dummy via hole 208. The first lower wiring 115a and a second lower wiring 115b may be exposed through the first via hole 201 and the second via hole 203, respectively.

A bottom surface of the dummy via hole 208 may be located below bottom surfaces of the first and second via holes 201 and 203. For example, the dummy via hole 208 may be formed at least partially through the lower insulation layer 110.

Figure 22:
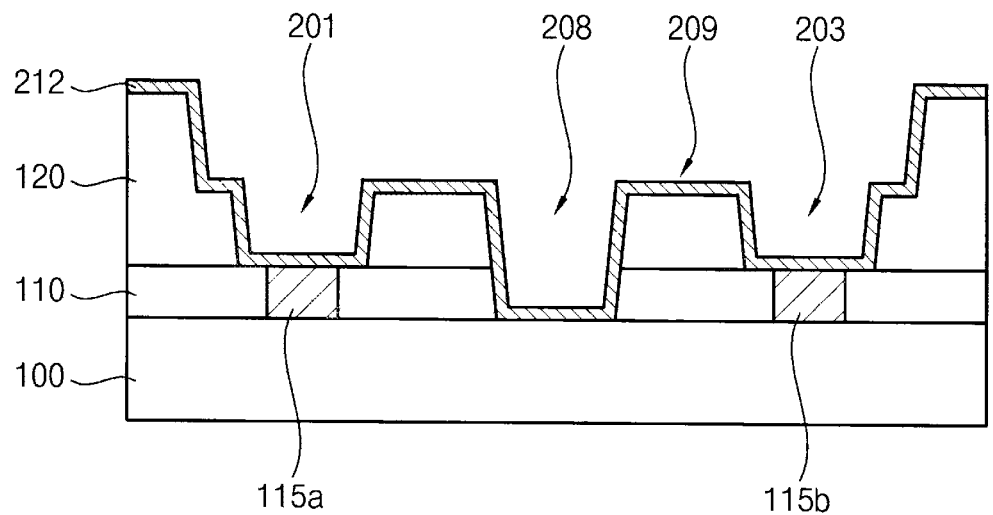

Referring to FIG. 22, as also illustrated with reference to FIG. 16, a trench 209 connected to the first via hole 201, the second via hole 203 and the dummy via hole 208 may be formed. A liner layer 212 having a conformal profile may be formed along a top surface of the insulating interlayer 120, and sidewalls and bottom surfaces of the first via hole 201, the second via hole 203, the dummy via hole 208 and the trench 209.

Figure 23:
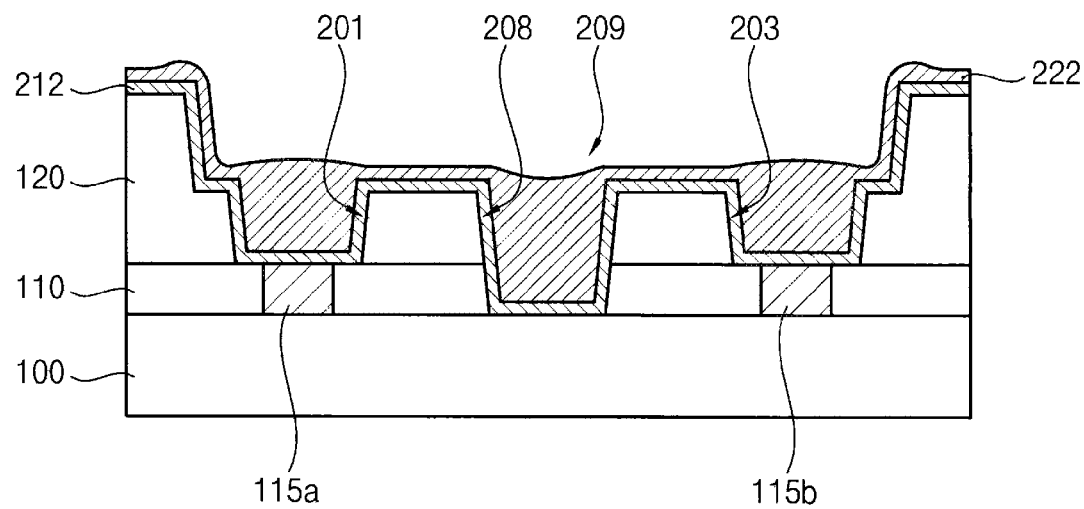

Referring to FIG. 23, as also illustrated with reference to FIG. 17, a first metal layer 222 may be formed on the liner layer 212 by, e.g., a Cu reflow process.

In example embodiments, the first metal layer 222 may be reflowed into the dummy via hole 208 having larger length or depth in advance. For example, filling of a reflow copper may be initiated from the dummy via hole 208, and then may be propagated to the first and second via holes 201 and 203 around the dummy via hole 208. Thus, a seed layer may be formed uniformly throughout a bottom surface of the trench 209.

Figure 24:
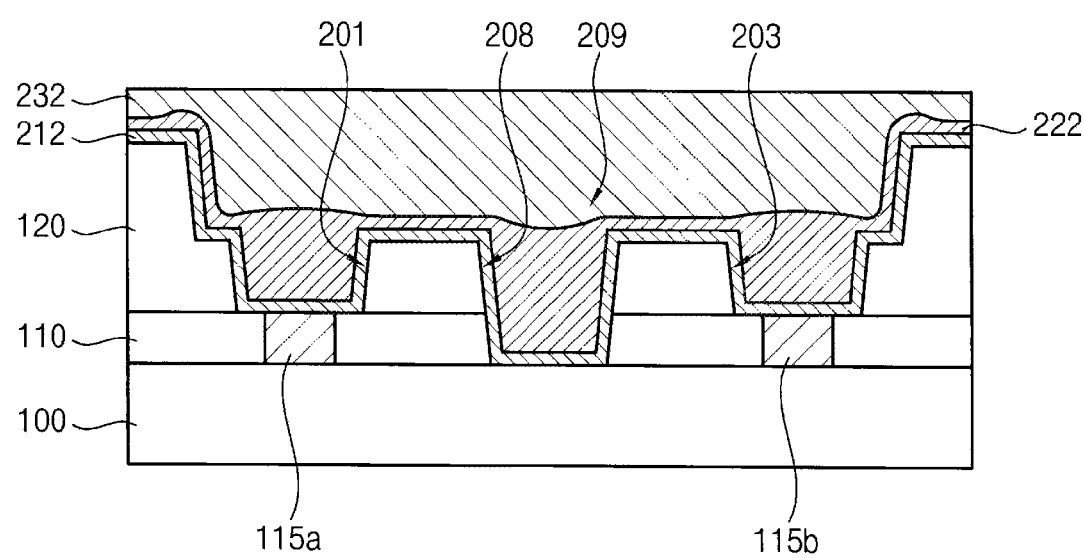

Referring to FIG. 24, as also illustrated with reference to FIG. 18, a second metal layer 232 may be formed by, e.g., a copper plating process on the first metal layer 222. The second metal layer 232 may fill a remaining portion of the trench 209, generating few or no defects, e.g., a void, therein.

As described above, the dummy via hole 208 may be provided as a prior reflow guide. Therefore, the first metal layer 222 may be diffused from the dummy via hole 208 to form the seed layer uniformly throughout the trench 209.

Figure 25:
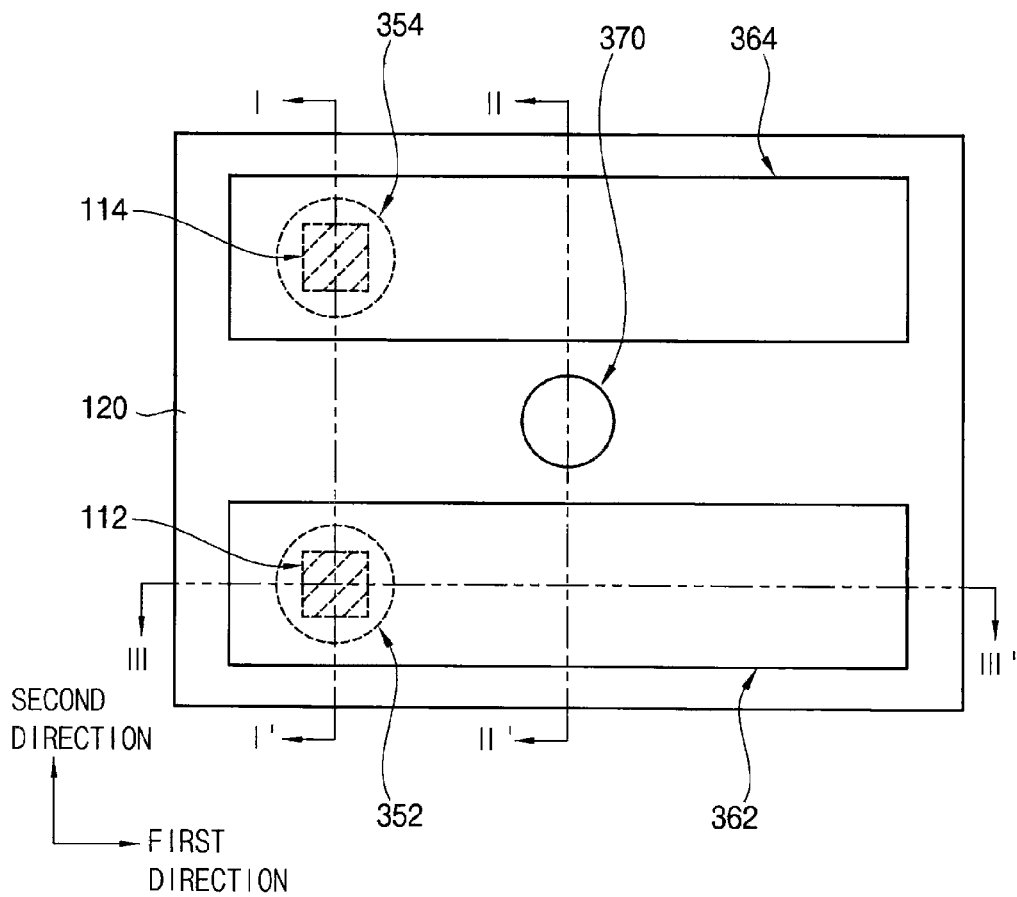
FIG. 25 is a top plan view illustrating a wiring structure in accordance with example embodiments.
Figure 26:
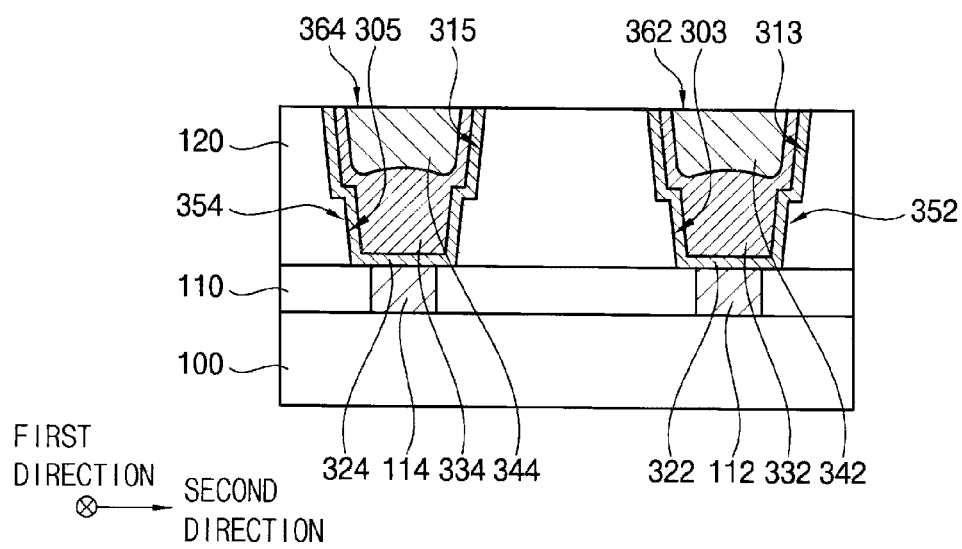
FIGS. 26, 27 and 28 are cross-sectional views taken along lines I-I', II-II' and III-III', respectively, indicated in FIG. 25.
Figure 27:
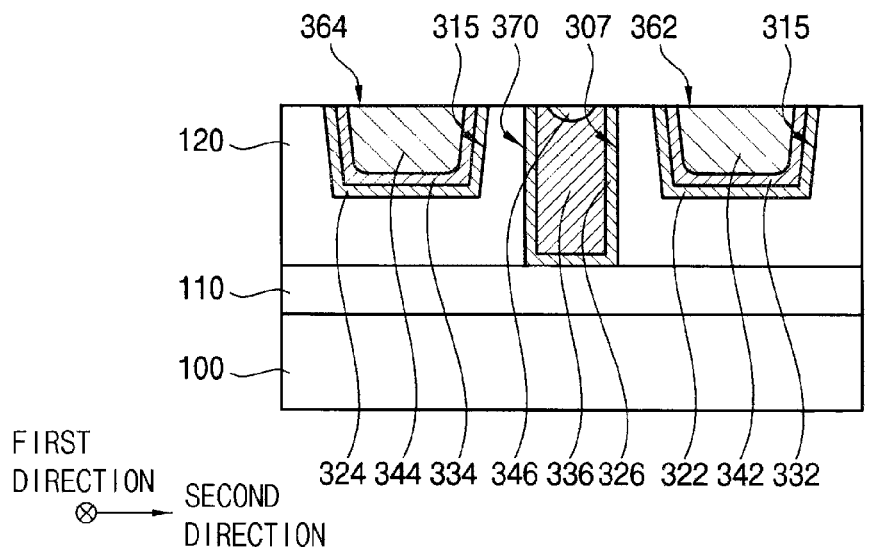
Figure 28:
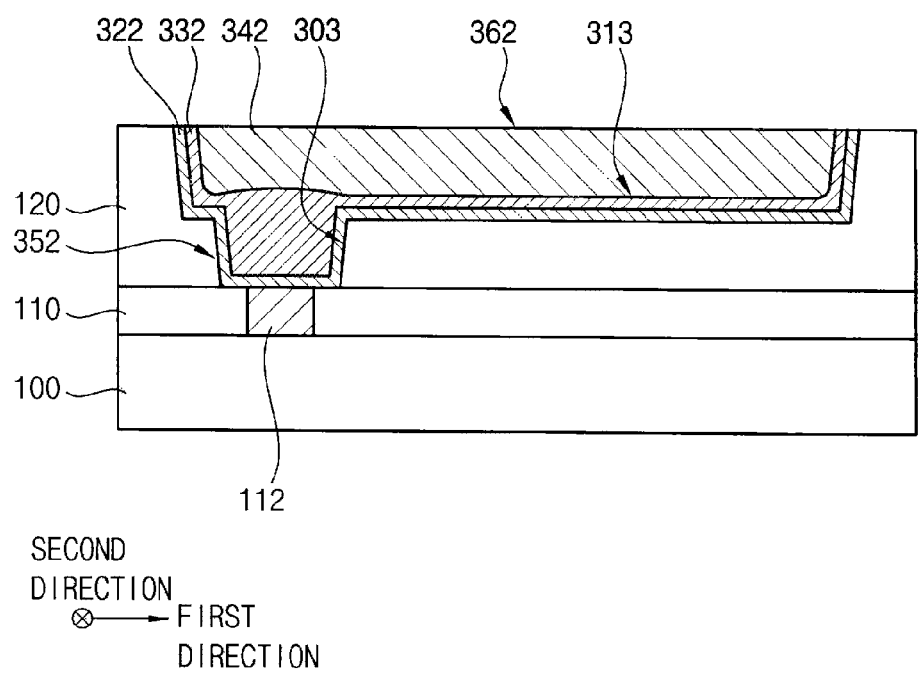

FIG. 25 is a top plan view illustrating a wiring structure in accordance with example embodiments. FIGS. 26, 27 and 28 are cross-sectional views taken along lines I-I', II-II' and III-III', respectively, indicated in FIG. 25.

Detailed descriptions on elements and/or materials substantially the same as or similar to those illustrated with reference to FIGS. 1 and 2 are omitted herein.

Two directions substantially parallel to a top surface of a substrate and perpendicular to each other are referred to as a first direction and a second direction. A direction indicated by an arrow and a reverse direction thereof are considered as the same direction. The above mentioned definitions of the directions are the same throughout FIGS. 29 to 52.

Referring to FIGS. 25 to 28, the wiring structure may include a plurality of wirings. For example, the plurality of the wirings may be arranged along the second direction. FIGS. 25 to 28 may illustrate two wirings among the plurality of the wirings.

For example, as illustrated in FIG. 25, a first wiring and a second wiring may be parallel to each other, and may extend in the first direction. The first wiring may include a first via structure 352 and a first line structure 362, and the second wiring may include a second via structure 354 and a second line structure 364.

The first via structure 352 and the second via structure 354 may be buried in a lower portion of an insulating interlayer 120, and may be electrically connected to a first lower wiring 112 and a second lower wiring 114, respectively, formed in a lower insulation layer 110.

The first line structure 362 and the second line structure 364 may be buried in an upper portion of the insulating interlayer 120 to be integral with the first via structure 352 and the second via structure 354, respectively.

The first via structure 352 may be formed in a first via hole 303. The first line structure 362 may be formed in a first trench 313 that may be connected to the first via hole 303 and may extend in the first direction.

In example embodiments, the first via structure 352 may be defined by portions of a liner pattern 322 and a first metal pattern 332 formed in the first via hole 303. The first line structure 362 may be defined by portions of the liner pattern 322, the first metal pattern 332 and a second metal pattern 342 formed in the first trench 313.

The second via structure 354 may be formed in a second via hole 305, and the second line structure 364 may be formed in a second trench 315.

In example embodiments, the second via structure 354 may be defined by portions of a liner pattern 324 and a first metal pattern 334 formed in a second via hole 305. The second line structure 364 may be defined by portions of the liner pattern 324, the first metal pattern 334 and a second metal pattern 344 formed in the second trench 315.

In example embodiments, an isolated dummy via structure 370 may be disposed between the first wiring and the second wiring. The isolated dummy via structure 370 may not be in contact with or electrically connected to the first and second wirings. The isolated dummy via structure 370 may substantially function as a reflow guide for forming the first and second metal patterns 332 and 334.

For example, the isolated dummy via structure 370 may be spaced apart from the first and second via structures 352 and 354 along the first direction, and may be disposed between the first and second line structures 362 and 364. In example embodiments, the isolated dummy via structure 370 may be adjacent to central portions of the first and second line structures 362 and 364.

The isolated dummy via structure 370 may be formed in an isolated dummy via hole 307 extending completely through the insulation layer 120. The isolated dummy via structure 370 may include a liner pattern 326, a first metal pattern 336 and a second metal pattern 346 sequentially formed in an inner wall of the isolated dummy via hole 307. In example embodiments, the isolated dummy via structure 370 may include the liner pattern 326 and the first metal pattern 336, and the second metal pattern 346 may be omitted.

In example embodiments, the isolated dummy via hole 307 may have a width or a diameter smaller than those of the first and second via holes 303 and 305.

In the first and second wirings, the liner patterns 322 and 324 may have a substantially uniform and conformal profile along sidewalls and bottom surfaces of the first and second via holes 303 and 305, and the first and second trenches 313 and 315. The first metal patterns 332 and 334 may sufficiently fill the first and second via holes 303 and 305, and may extend on sidewalls and bottom surfaces of the first and second trenches 313 and 315. The second metal patterns 342 and 344 may fill remaining portions of the first and second trenches 313 and 315 on the first metal patterns 332 and 334.

FIGS. 29 to 41 are cross-sectional views illustrating a method of forming a wiring structure in accordance with example embodiments. Specifically, FIGS. 29, 30, 33, 36 and 39 are cross-sectional views taken along a line I-I' indicated in FIG. 25. FIGS. 31, 34, 37 and 40 are cross-sectional views taken along a line II-II' indicated in FIG. 25. FIGS. 32, 35, 38 and 41 are cross-sectional views taken along a line III-III' indicated in FIG. 25.

For example, FIGS. 29 to 41 are cross-sectional views illustrating a method of forming the wiring structure of FIGS. 25 to 28. Detailed descriptions on processes substantially the same as or similar to those illustrated with reference to FIGS. 3 to 9 are omitted herein.

Figure 29:
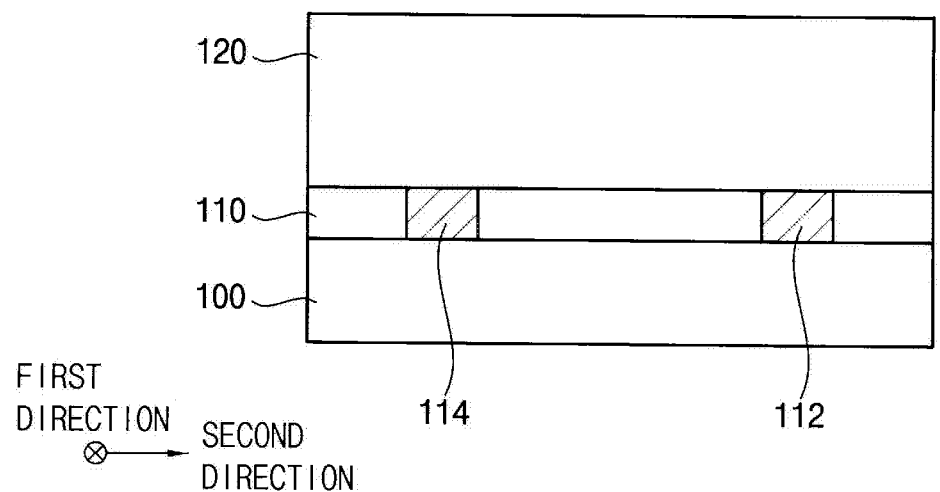
FIGS. 29 to 41 are cross-sectional views illustrating a method of forming a wiring structure in accordance with example embodiments.

Referring to FIG. 29, a lower structure including a lower wiring and a lower insulation layer 110 may be formed on a substrate by, e.g., a process substantially the same as or similar to that illustrated with reference to FIG. 3. The lower wiring may include a first lower wiring 112 and a second lower wiring 114 spaced apart from each other along the second direction. An insulating interlayer 120 may be formed on the lower structure.

Figure 30:
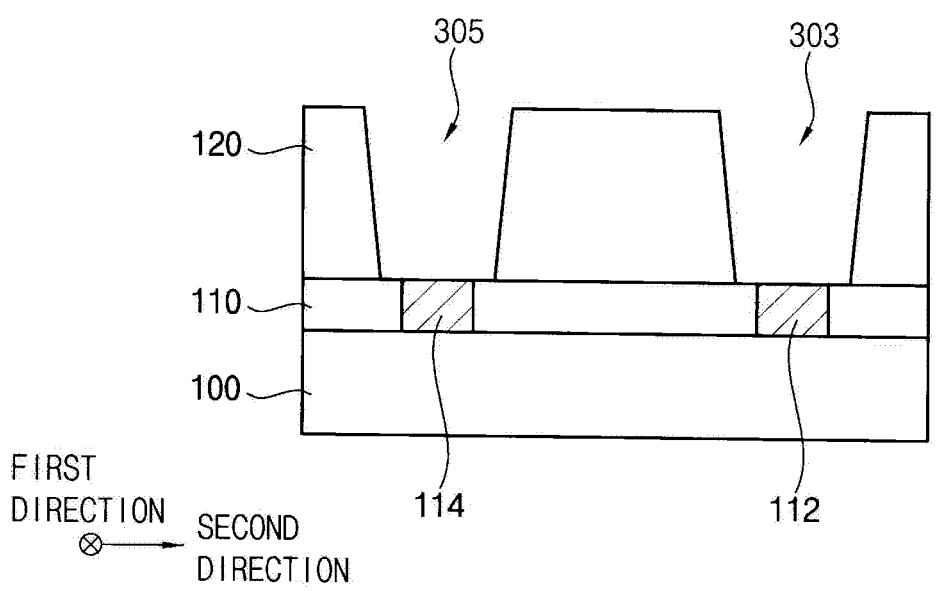
Figure 31:
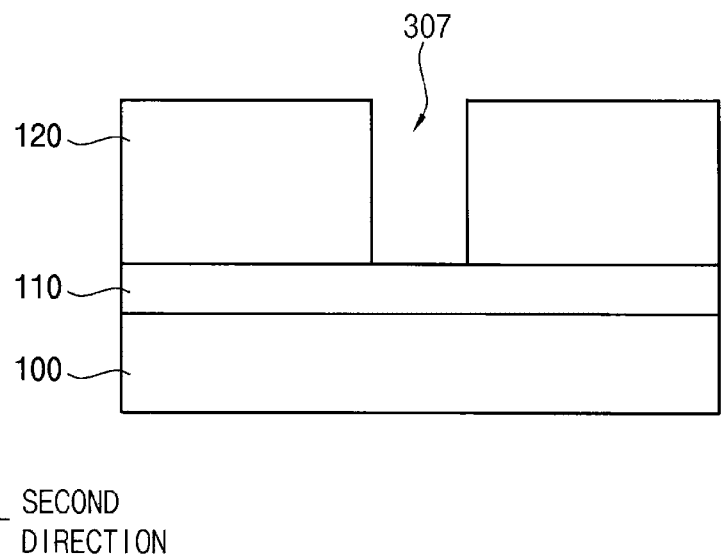
Figure 32:
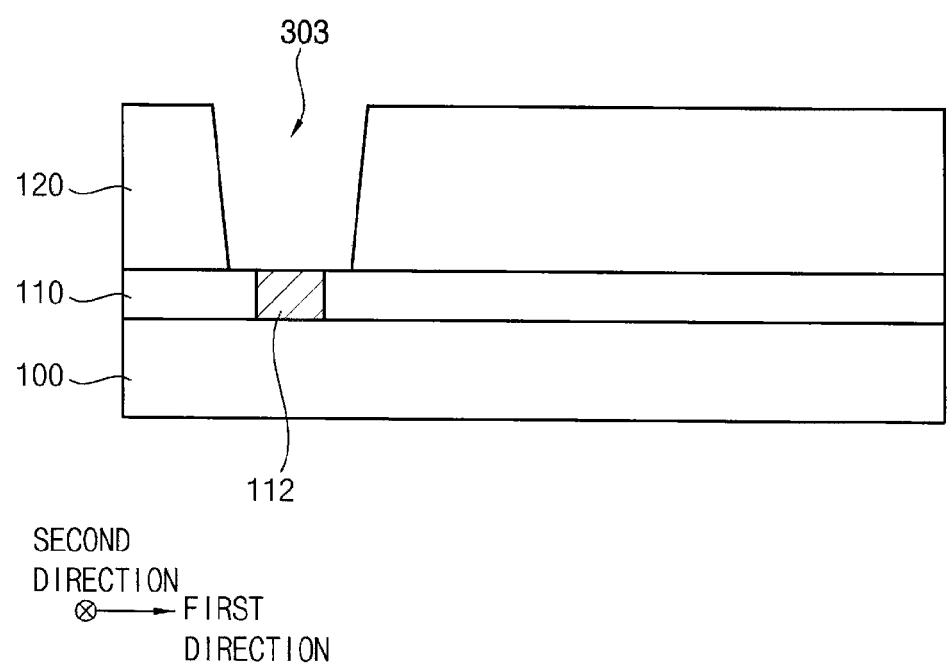

Referring to FIGS. 30 to 32, the insulating interlayer 120 may be partially etched to form a first via hole 303, a second via hole 305 and an isolated dummy via hole 307.

Top surfaces of the first lower wiring 112 and the second lower wiring 114 may be at least partially exposed through the first via hole 303 and the second via hole 305, respectively. The isolated dummy via hole 307 may be formed at a region spaced apart from the first via hole 303 and the second via hole 305 along, e.g., the first direction, and may expose a top surface of the lower insulation layer 110.

In example embodiments, the isolated dummy via hole 307 may have a width or a diameter smaller than those of the first via hole 303 and the second via hole 305.

Figure 33:
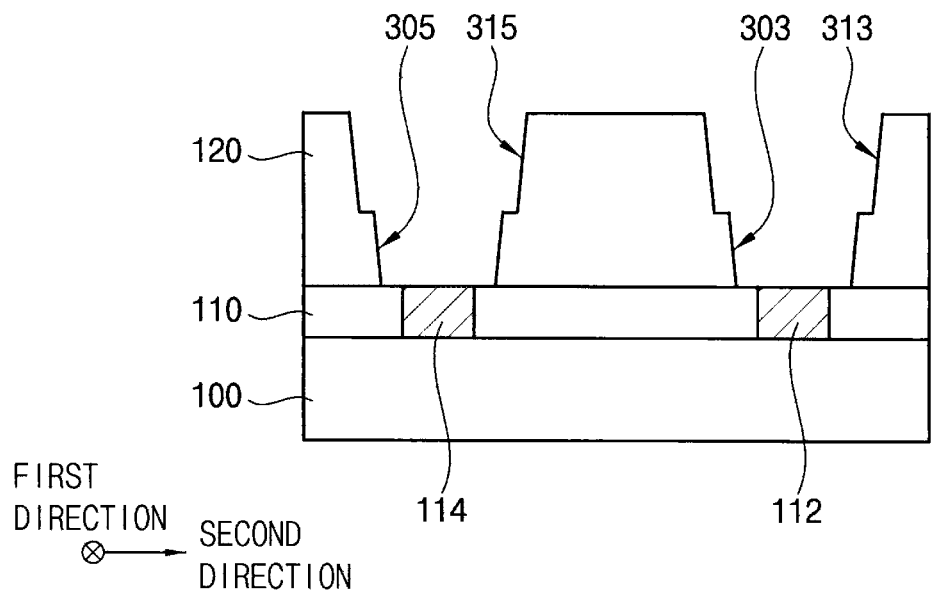
Figure 34:
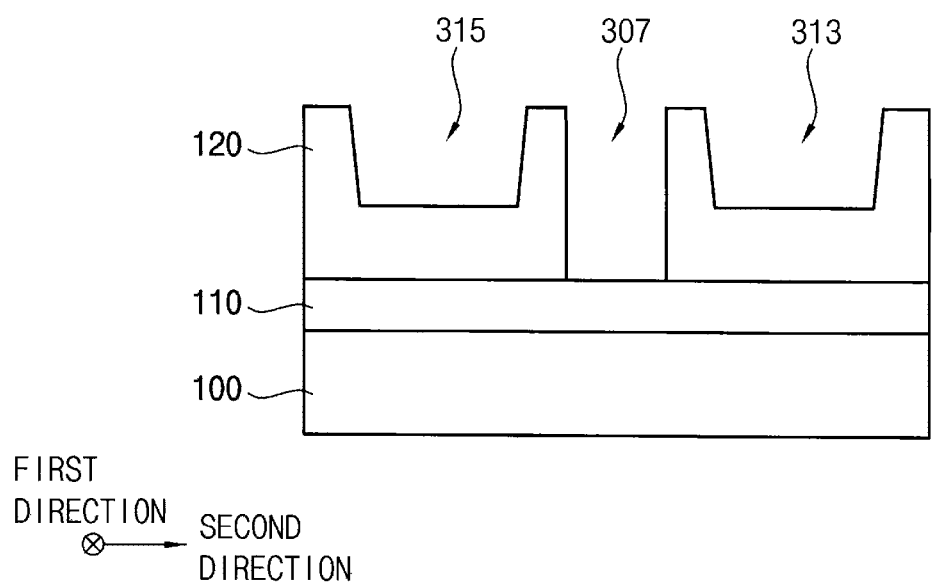
Figure 35:
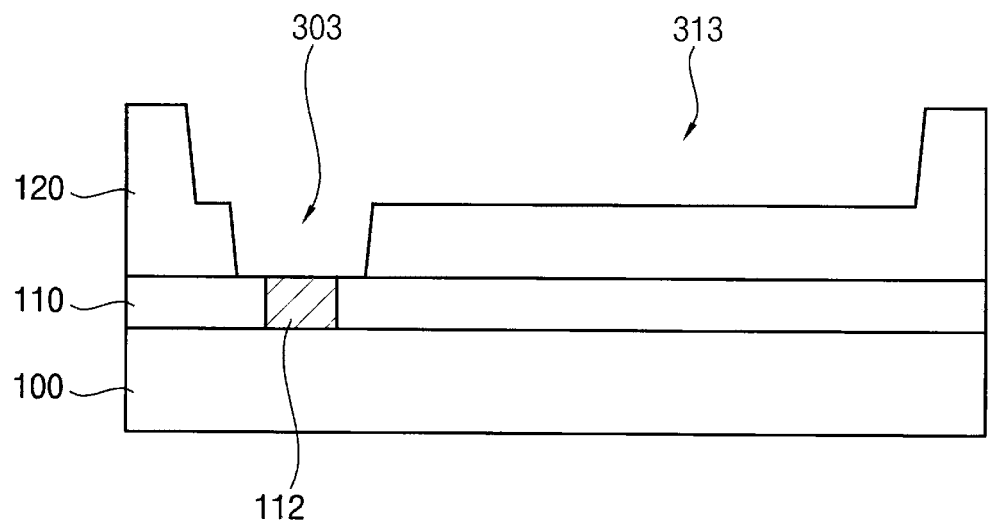

Referring to FIGS. 33 to 35, an upper portion of the insulating interlayer 120 may be partially removed to form a first trench 313 and a second trench 315. The first trench 313 and the second trench 315 may be connected to the first via hole 303 and the second via hole 305, respectively, and may extend in the first direction.

The isolated dummy via hole 307 may be physically separated from the first trench 313 and the second trench 315. In example embodiments, the first trench 313 and the second trench 315 may parallel to each other with respect to the isolated dummy via hole 307.

Figure 36:
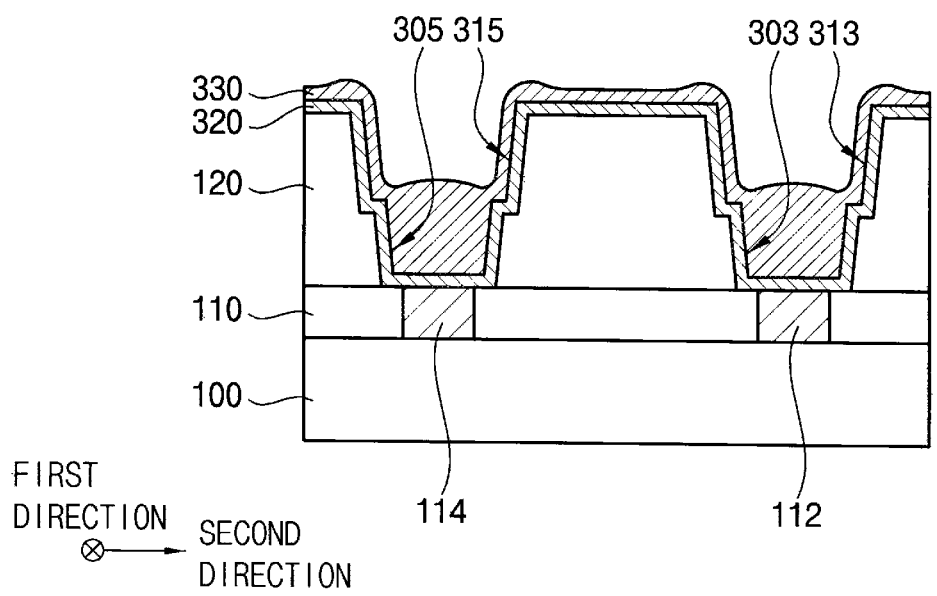
Figure 37:
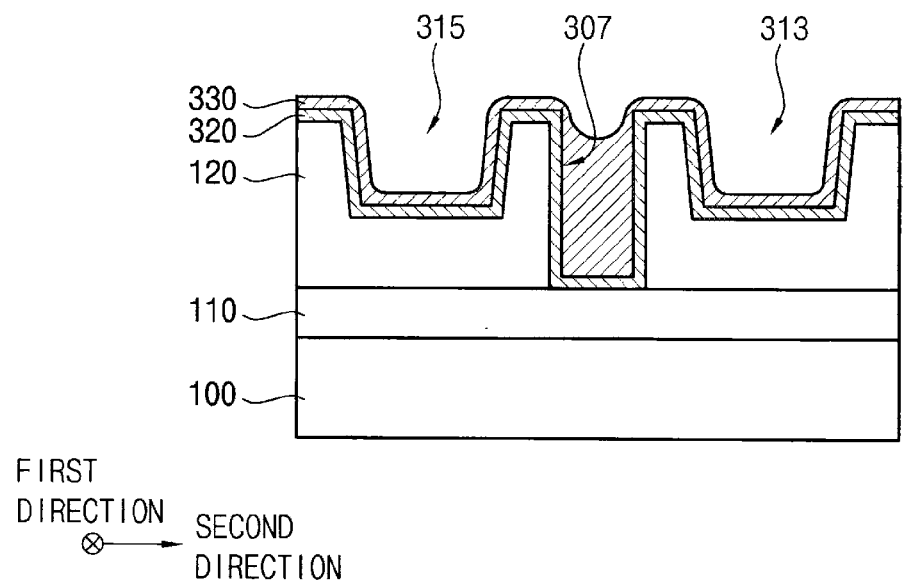
Figure 38:
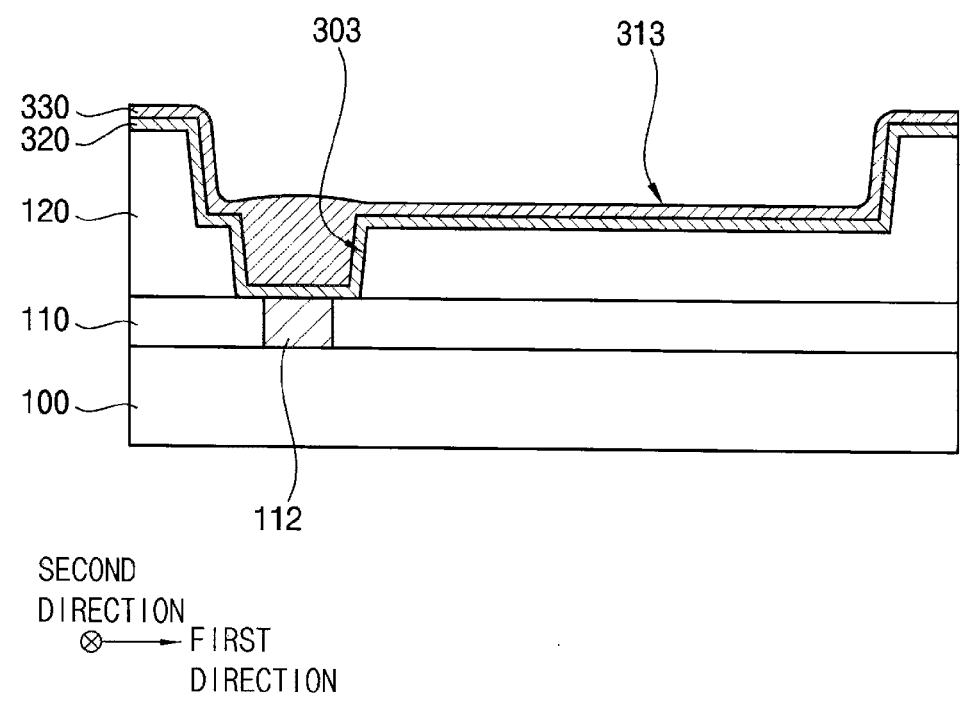

Referring to FIGS. 36 to 38, processes substantially the same as or similar to those illustrated with reference to FIGS. 6 and 7 may be performed.

Accordingly, a liner layer 320 having a substantially uniform profile may be formed along a top surface of the insulating interlayer 120, and sidewalls and bottom surfaces of the first and second via holes 303 and 305, the first and second trenches 313 and 315, and the isolated dummy via hole 307. As described above, the liner layer 320 may be formed of a CVD-Ru.

Subsequently, a first metal layer 330 may be formed on the liner layer 320 by a Cu reflow process.

In example embodiments, the first metal layer 330 may be reflowed into the first via hole 303, the second via hole 305 and the isolated dummy via hole 307, and may extend on a sidewall and a bottom surface of the first and second trenches 313 and 315.

In example embodiments, the first metal layer 330 may sufficiently fill the first via hole 303 and the second via hole 305, and may partially fill the isolated dummy via hole 307. In example embodiments, if the isolated dummy via hole 307 may have a relatively small width, the first metal layer 330 may substantially fully fill the isolated dummy via hole 307.

As described above, the isolated dummy via hole 307 may be formed between the trenches 313 and 315 having a relatively large length to provide a reflow guide for forming the first metal layer 330. Thus, the reflow guide may be commonly provided for a plurality of the trenches without individually forming a dummy via hole per each trench.

Figure 39:
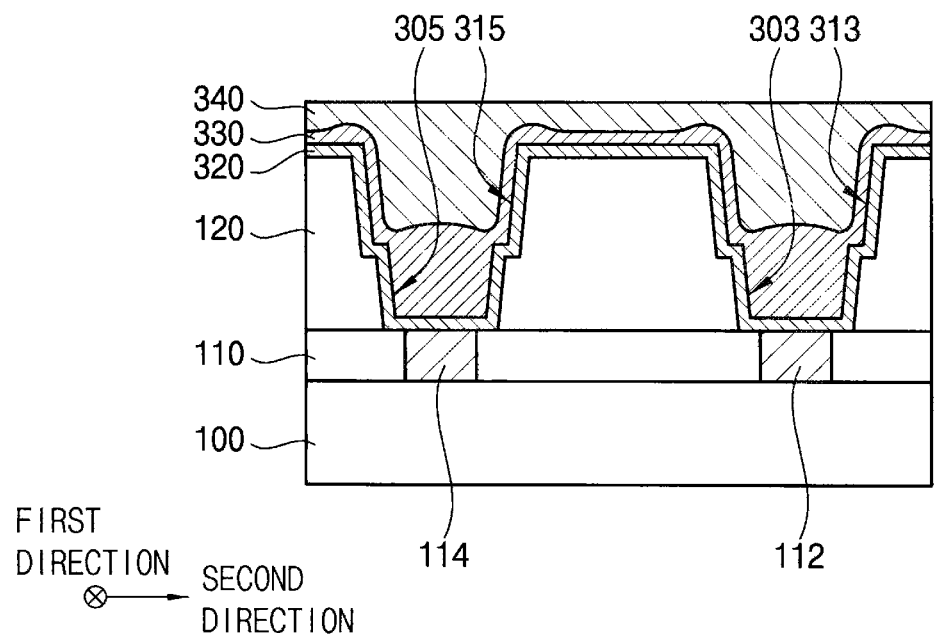
Figure 40:
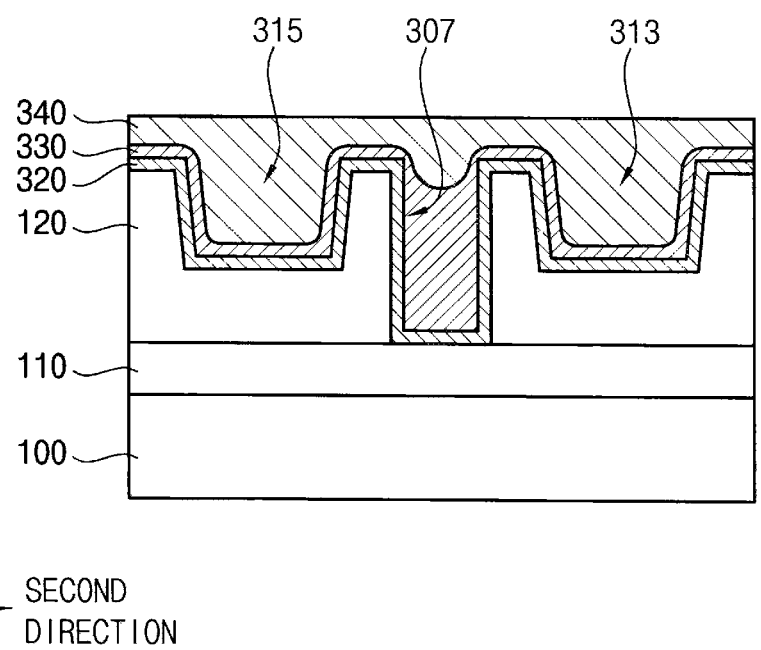
Figure 41:
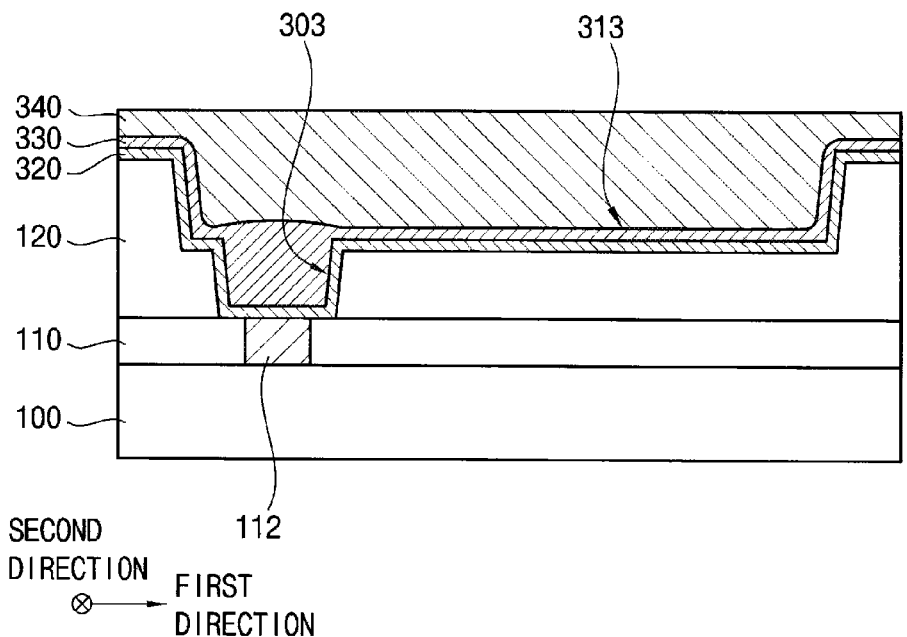

Referring to FIGS. 39 to 41, a process substantially the same as or similar to that illustrated with reference to FIG. 8 may be performed to form a second metal layer 340.

For example, a copper plating process may be performed to form a second metal layer 340 filling remaining portions of the first and second trenches 313 and 315, and the isolated dummy via hole 307 from the first metal layer 330.

As described above, a sufficient seed layer may be achieved by utilizing the isolated dummy via hole 307 so that the second metal layer 340 filling the trenches, generating relatively few or no voids therein may be formed even when a plurality of the trenches having a large length are present.

Upper portions of the second metal layer 340, the first metal layer 330 and the liner layer 320 may be planarized by a CMP process until the top surface of the insulating interlayer 120 is exposed to form the wiring structure illustrated in FIGS. 25 to 28.

Figure 42:
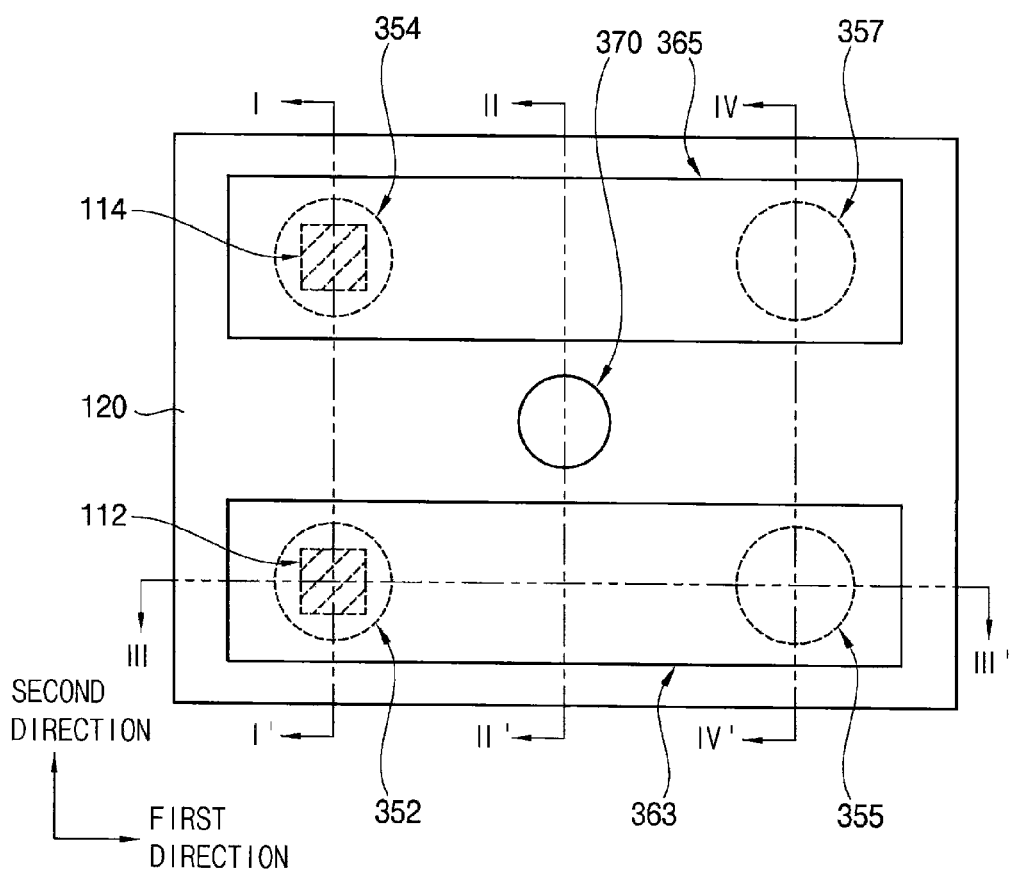
FIG. 42 is a top plan view illustrating a wiring structure in accordance with example embodiments.
Figure 43:
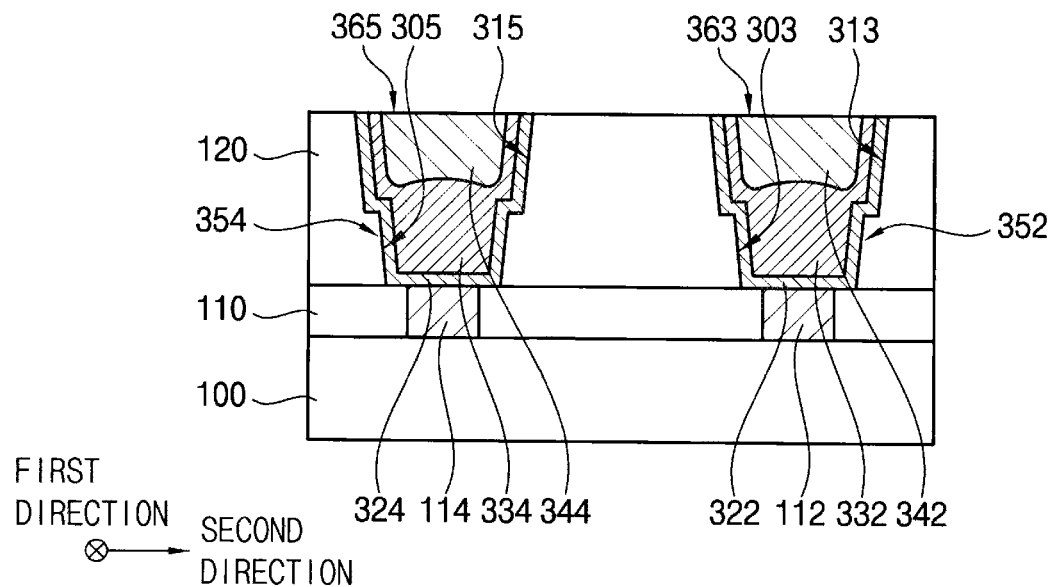
FIGS. 43, 44, 45 and 46 are cross-sectional views taken along lines I-I', II-II', III-III' and IV-IV', respectively, indicated in FIG. 42.
Figure 44:
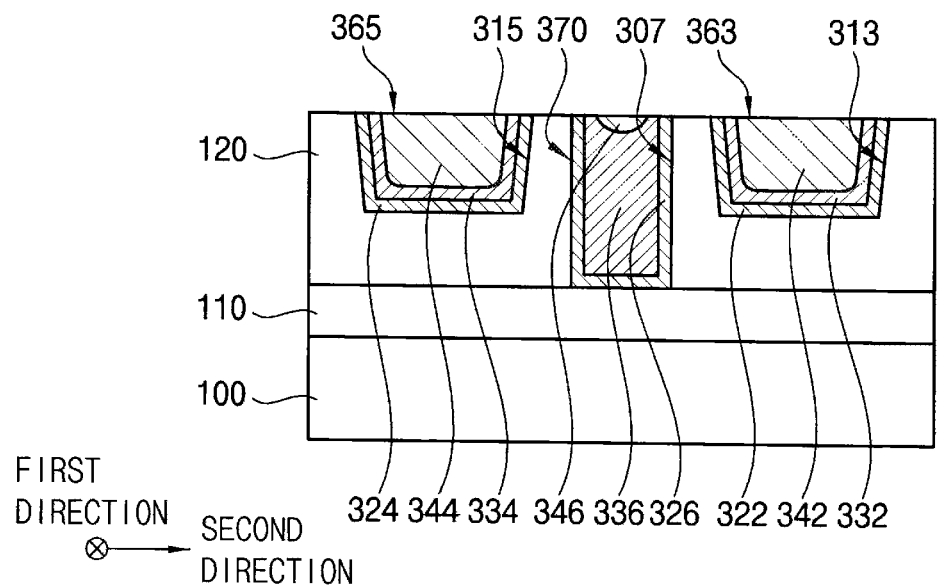
Figure 45:
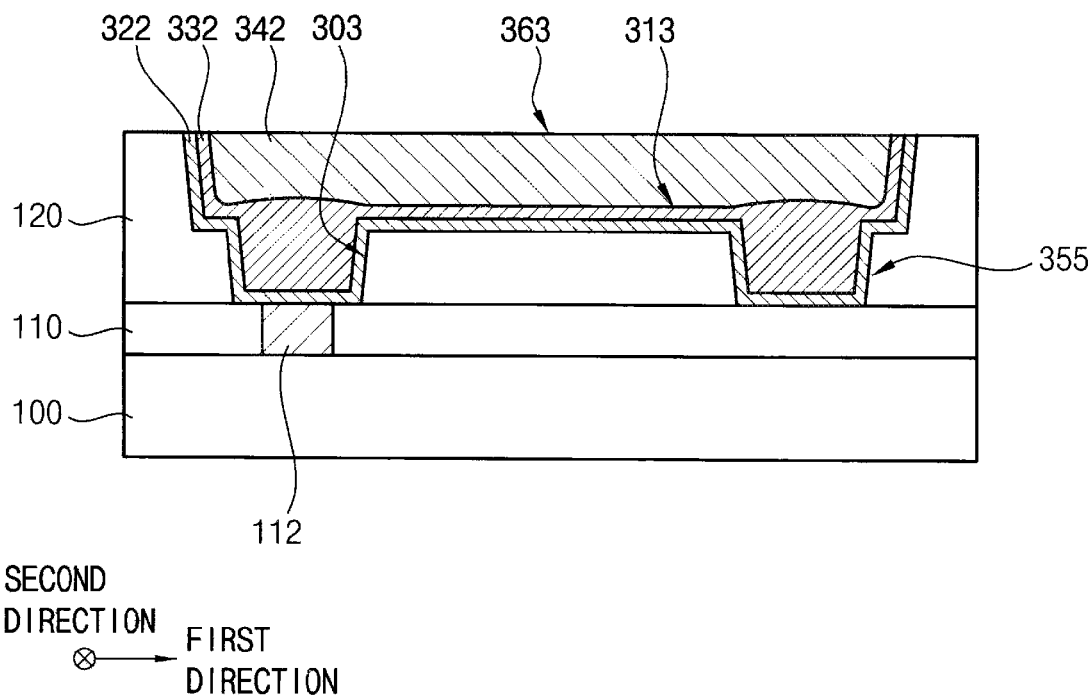
Figure 46:
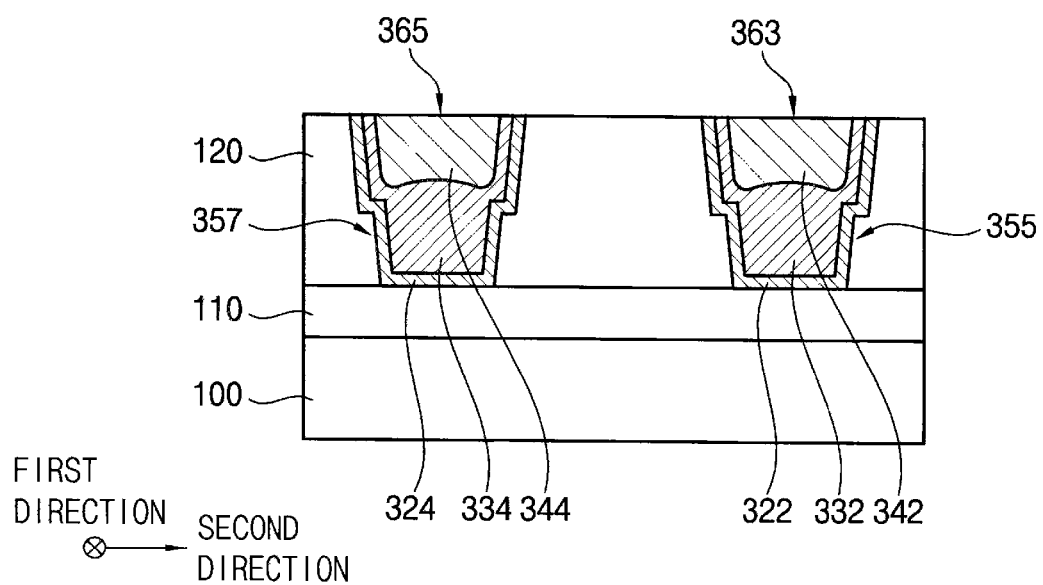

FIG. 42 is a top plan view illustrating a wiring structure in accordance with example embodiments. FIGS. 43, 44, 45 and 46 are cross-sectional views taken along lines I-I', II-II', III-III' and IV-IV', respectively, indicated in FIG. 42.

The wiring structure of FIGS. 42 to 46 may have elements and/or construction substantially the same as or similar to those of the wiring structure illustrated in FIGS. 25 to 28 except for an addition of a dummy via hole. Thus, detailed descriptions on repeated elements and/or structures are omitted herein, and like reference numerals are used to designate like elements.

Referring to FIGS. 42 to 46, the wiring structure may include a plurality of wirings, and am isolated dummy via hole 370 may be formed between the wirings.

In example embodiments, each wiring may have elements and/or constructions substantially the same as or similar to those of the wiring structure illustrated in FIGS. 1 and 2.

For example, a first wiring may include a first wiring structure 352 and a first dummy via structure 355, and may include a first line structure 363 integrally connected to the first via structure 352 and the first dummy via structure 363.

A second wiring may include a second via structure 354 and a second dummy via structure 357, and may include a second line structure 365 integrally connected to the second via structure 354 and the second dummy via structure 357.

The first via structure 352 and the first dummy via structure 355 may be substantially filled with a liner pattern 322 and a first metal pattern 332, and the first line structure 363 may be defined by the liner pattern 322, the first metal pattern 332 and a second metal pattern 342.

The second via structure 354 and the second dummy via structure 357 may be substantially filled with a liner pattern 324 and a first metal pattern 334, and the second line structure 365 may be defined by the liner pattern 324, the first metal pattern 334 and a second metal pattern 344.

An isolated dummy via structure 370 may be defined by a liner pattern 326, a first metal pattern 336 and a second metal pattern 346 filling an isolated dummy via hole 307.

According to example embodiments as described above, the dummy via structure 355 and 357 may be integrally connected to the each wiring, and may serve as an individual reflow guide for the each wiring. Further, the isolated dummy via structure 370 may be provided between the wirings, and may serve as a common reflow guide for the wirings. Thus, a continuous seed layer may be achieved so that a plating process of relatively high reliability may be performed even when a plurality of the wirings having a large length are present.

In example embodiments, the isolated dummy via structure 370 may be formed at a position corresponding to a center of a polygon defined by the via structures and the dummy via structures adjacent to each other. For example, as illustrated in FIG. 42, the isolated dummy via structure 370 may be formed at a center of a tetragon defined by the first and second via structures 352 and 354, and the dummy via structure 355 and 357. Thus, the isolated dummy via structure 370 may serve as a deposition center for a uniform reflow process.

FIGS. 47 to 52 are perspective views and cross-sectional views illustrating a method of manufacturing a semiconductor device in accordance with example embodiments. For example, FIGS. 47 to 52 illustrate a method of a manufacturing a semiconductor device including a fin field-effect transistor (FinFET).

Figure 47:
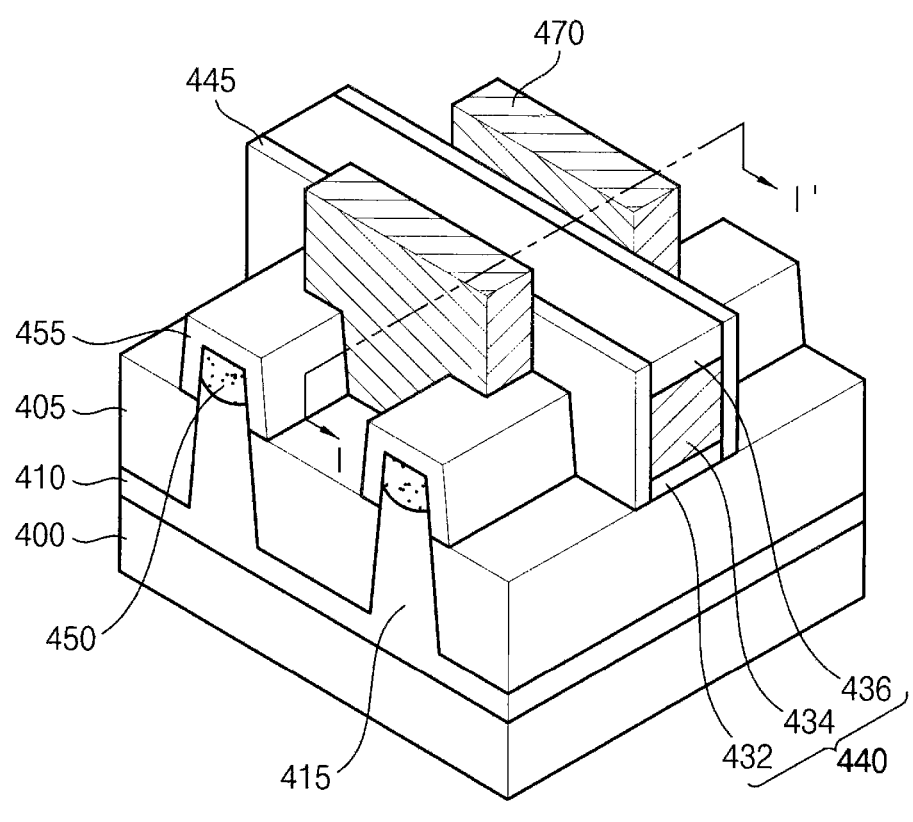

Specifically, FIG. 47 is a perspective view illustrating the method. FIGS. 48 to 52 are cross-sectional views taken along a line I-I' of FIGS. 48 to 52.

For example, detailed descriptions on processes substantially the same as or similar to those illustrated with reference to FIGS. 3 to 9, or FIGS. 29 to 41 are omitted herein.

Figure 48:
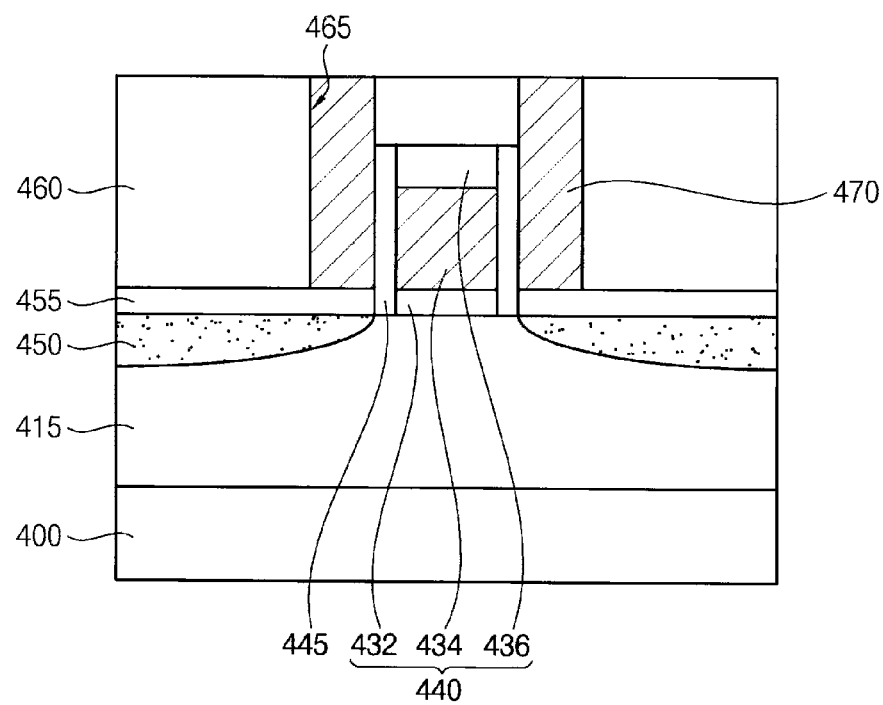

Referring to FIGS. 47 and 48, a gate structure 440 crossing a semiconductor fin may be formed on a substrate 400, and a contact 470 adjacent to the gate structure 440 may be formed to be electrically connected to the semiconductor fin.

In example embodiments, a channel layer 410 may be formed on the substrate 400. An isolation layer 405 may be formed at an upper portion of the channel layer 410 by, e.g., a shallow trench isolation (STI) process. The isolation layer 405 may be formed of, e.g., silicon oxide.

A plurality of protrusions may be formed from the channel layer 410 by the formation of the isolation layer 405, and the protrusions may be defined as active patterns 415. Each active pattern 415 may extend in the second direction.

The substrate 400 may include a semiconductor material, e.g., silicon. In example embodiments, the substrate 400 may be an SOI substrate or a GOI substrate.

The channel layer 410 may include silicon combined with a stress generating element. In example embodiments, the channel layer 410 may include silicon-germanium (Si—Ge).

The channel layer 410 may be formed by a selective epitaxial growth (SEG) process. For example, a silicon source gas and a germanium source gas may be provided on the substrate 400. A top surface of the substrate 400 may serve as a seed layer, and the channel layer 410 including Si—Ge may be grown from the seed layer.

For example, the silicon source may include silane ($SiH_4$) or dichlorosilane ($SiH_2Cl_2$). The germanium source gas may include germanium tetrahydride ($GeH_4$) or germanium tetrachloride ($GeCl_4$).

In example embodiments, an ion-implantation process may be performed on the active pattern 415 to form a well at an upper region of the active pattern 415.

An upper portion of the isolation layer 405 may be removed by an etch-back process to expose an upper portion of the active pattern 415. The upper portion of the active pattern 415 protruding from a top surface of the isolation layer 405 may be defined as the semiconductor fin. The semiconductor fin may extend in the second direction, and a plurality of the semiconductor fins may be arranged along the first direction.

The gate structure extending in the first direction and crossing the semiconductor fins may be formed. The gate structure 440 may include a gate insulation pattern 432, a gate electrode 434 and a gate mask 436 sequentially formed on the isolation layer 405 and the semiconductor fin. A gate spacer 445 may be further formed on a sidewall of the gate structure 440.

In example embodiments, a gate insulation layer, a gate electrode layer and a gate mask layer may be sequentially formed on the isolation layer 405 and the semiconductor fins, and may be patterned by a photolithography process to form the gate structure 440 including the gate mask 436, the gate electrode 434 and the gate insulation pattern 432. A spacer layer covering the gate structure 440 may be formed on the isolation layer 405 and the semiconductor fins, and may be anisotropically etched to form the gate spacer 445.

The gate insulation layer may be formed of silicon oxide or a metal oxide. The gate electrode layer may be formed of a metal, a metal nitride, doped polysilicon and/or a metal silicide. The gate mask layer and the spacer layer may be formed of silicon nitride.

In example embodiments, the gate structure 440 may be formed by a damascene process. For example, a dummy pattern extending in the first direction and crossing the semiconductor fins may be formed, and the gate spacer 445 may be formed on a sidewall of the dummy pattern. The dummy pattern may be removed to form an opening between a pair of the gate spacers 445, and the gate insulation layer pattern 432, the gate electrode 434 and the gate mask 436 may be sequentially formed in the opening to form the gate structure 440.

In this case, the gate insulation layer pattern 432 may have a substantially U-shaped cross-section along an inner wall of the opening.

An ion-implantation process may be performed using the gate structure 440 as an implantation mask to form a first source/drain region 450. The first source/drain region 450 may serve as a lightly doped drain (LDD) region. A FinFET may be defined by the active pattern 415, the gate structure 440 and the first source/drain region 450.

In example embodiments, a second source/drain region 455 may be further formed on the semiconductor fin and/or the first source/drain region 450.

For example, an SEG process may be performed using the semiconductor fin and/or the first source/drain region 450 as a seed layer, and using a silicon source gas (e.g., dicholorosilane) as a reactive gas to form an elevated source/drain (ESD) layer. Impurities may be implanted into the ESD layer to form the second source/drain region 455.

In example embodiments, while performing the SEG process, a germanium source gas or a hydrocarbon gas may be provided together with the silicon source gas. In this case, a stress may be created from the second source/drain region 455 to facilitate a charge mobility on a FinFET channel.

The contact 470 may be electrically connected to the second source/drain region 455.

For example, a first lower insulation layer 460 covering the second source/drain region 455, the gate spacer 445 and the gate structure 440 may be formed on the isolation layer 405. For convenience of descriptions, an illustration of the first lower insulation layer 460 is omitted in FIG. 47. The first lower insulation layer 460 may be formed of a silicon oxide-based material by a CVD process.

The first lower insulation layer 460 may be partially etched to form a contact hole 465 through which the second source/drain region 455 may be at least partially exposed. The contact hole 465 may be self-aligned with the gate spacer 445. An SEG process may be performed using the second source/drain region 455 exposed through the contact hole 465 to form a preliminary contact layer filling the contact hole 465. Impurities may be implanted into the preliminary contact layer to form the contact 470 filling the contact hole 465 and electrically connected to the second source/drain region 455.

In example embodiments, the contact 470 may be formed by depositing a metal, a metal nitride, a metal silicide or polysilicon in the contact hole 465 through, e.g., an ALD process, a PVD process or a CVD process.

In example embodiments, a plurality of the second source/drain regions 455 may be exposed by one contact hole 465. For example, two second source/drain regions 455 neighboring in the first direction may be exposed by the one contact hole 465. In this case, as illustrated in FIG. 47, one contact 470 may be in contact with the two second source/drain regions 455. Thus, an alignment tolerance for the contact 470 may be increased.

Further, the second source/drain region 455 may serve as a pad expanded from the semiconductor fin for landing the contact 470. Thus, the alignment tolerance may be additionally obtained from the expanded area of the second source/drain region 455.

Figure 49:
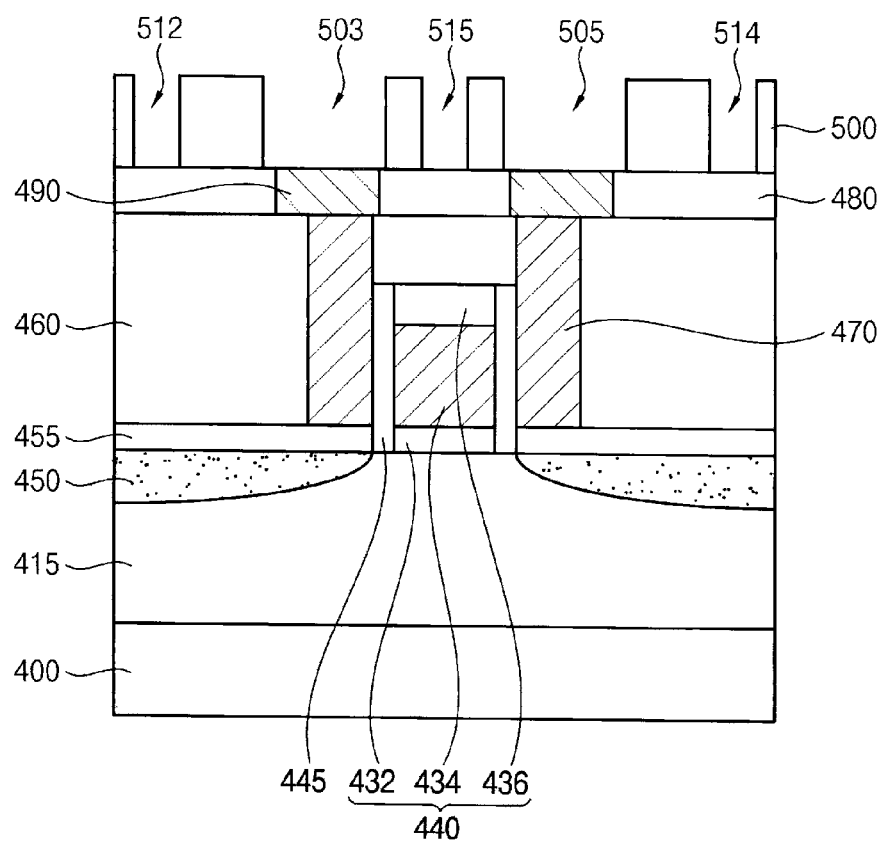

Referring to FIG. 49, as also illustrated with reference to FIG. 3, a second lower insulation layer 480 and lower wirings 490 may be formed on the first lower insulation layer 460 and the contact 470.

Subsequently, a BEOL process including processes substantially the same as or similar to those illustrated with reference to FIGS. 3 to 9, or FIGS. 29 to 41 may be performed.

For example, an insulating interlayer 500 may be formed on the second lower insulation layer 480 and the lower wirings 490. The insulating interlayer 500 may be partially removed to form a first via hole 503, a second via hole 505, a first dummy via hole 512, a second dummy via hole 514 and an isolated dummy via hole 515.

A top surface of each lower wiring 490 may be at least partially exposed through the first via hole 503 and the second via hole 505. A top surface of the second lower insulation layer 480 may be exposed through the first and second dummy via holes 512 and 514, and the isolated dummy via hole 515, and the lower wiring 490 may not be exposed therethrough.

Figure 50:
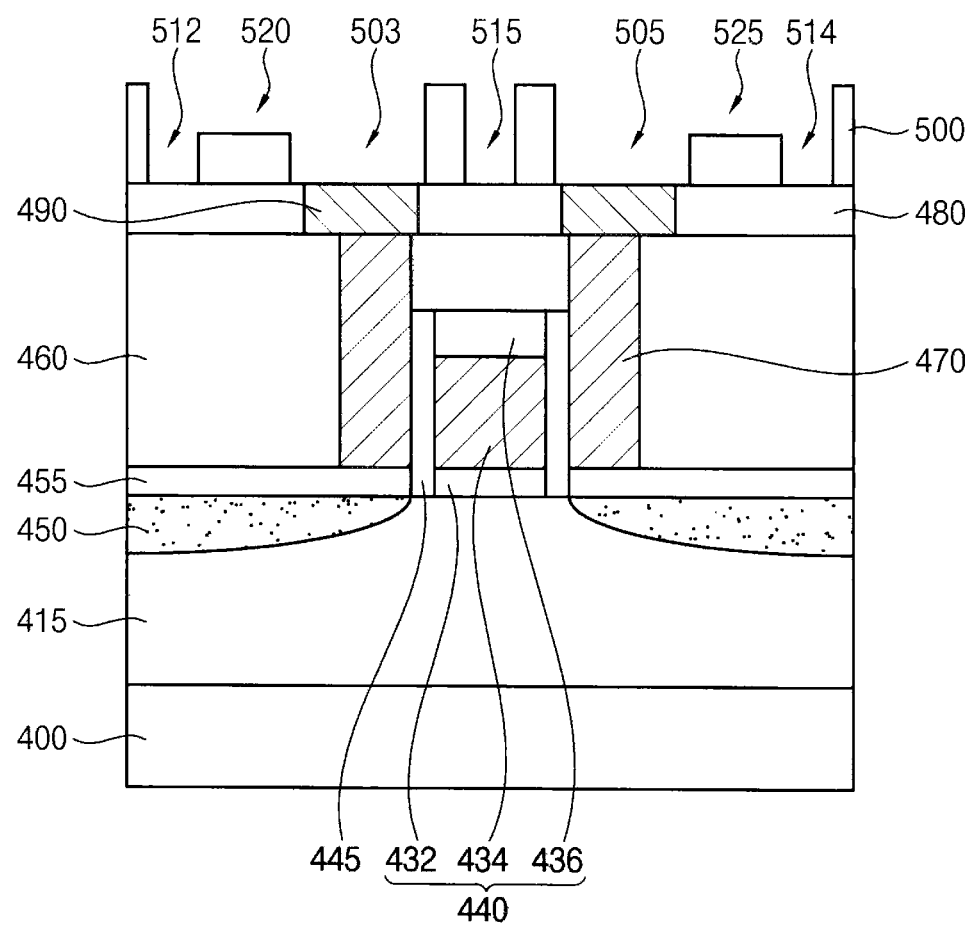

Referring to FIG. 50, as also illustrated with reference to FIG. 5, an upper portion of the insulating interlayer 500 may be partially removed to form a first trench 520 and a second trench 525.

The first via hole 503 and the first dummy via hole 512 may be connected to each other via the first trench 520 to form a first opening. The second via hole 505 and the second dummy via hole 514 may be connected to each other via the second trench 525 to form a second opening.

The isolated dummy via hole 515 may extend substantially completely through the insulating interlayer 500, and may be separated from the first and second openings.

Figure 51:
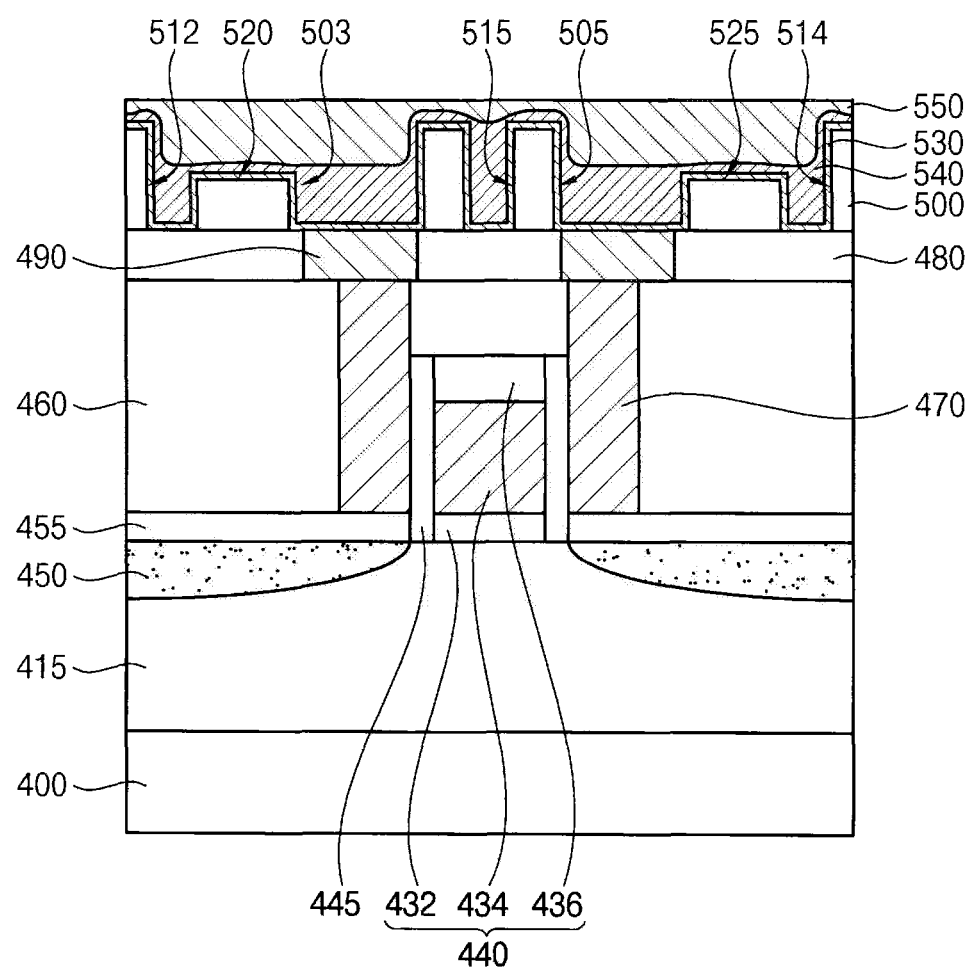

Referring to FIG. 51, processes substantially the same as or similar to those illustrated with reference to, e.g., FIGS. 6 to 8, or FIGS. 36 to 41 may be performed.

Accordingly, a liner layer 530, a first metal layer 540 and a second metal layer 550 may be sequentially formed on a top surface of the insulating interlayer 500, and on sidewalls and bottom surfaces of the first and second via holes 503 and 505, the first and second dummy via holes 512 and 514, the isolated dummy via hole 515, and the first and second trenches 520 and 525.

For example, the liner layer 530 may be formed of a CVD-Ru. The first metal layer 540 may be formed by a Cu reflow process. The second metal layer 550 may be formed by a Cu plating process from the first metal layer 540.

In example embodiments, the first metal layer 540 may sufficiently fill the first and second via holes 503 and 505, the first and second dummy via holes 512 and 514, and the isolated dummy via hole 515. The second metal layer 550 may sufficiently fill the first and second trenches 520 and 525 on the first metal layer 540.

Figure 52:
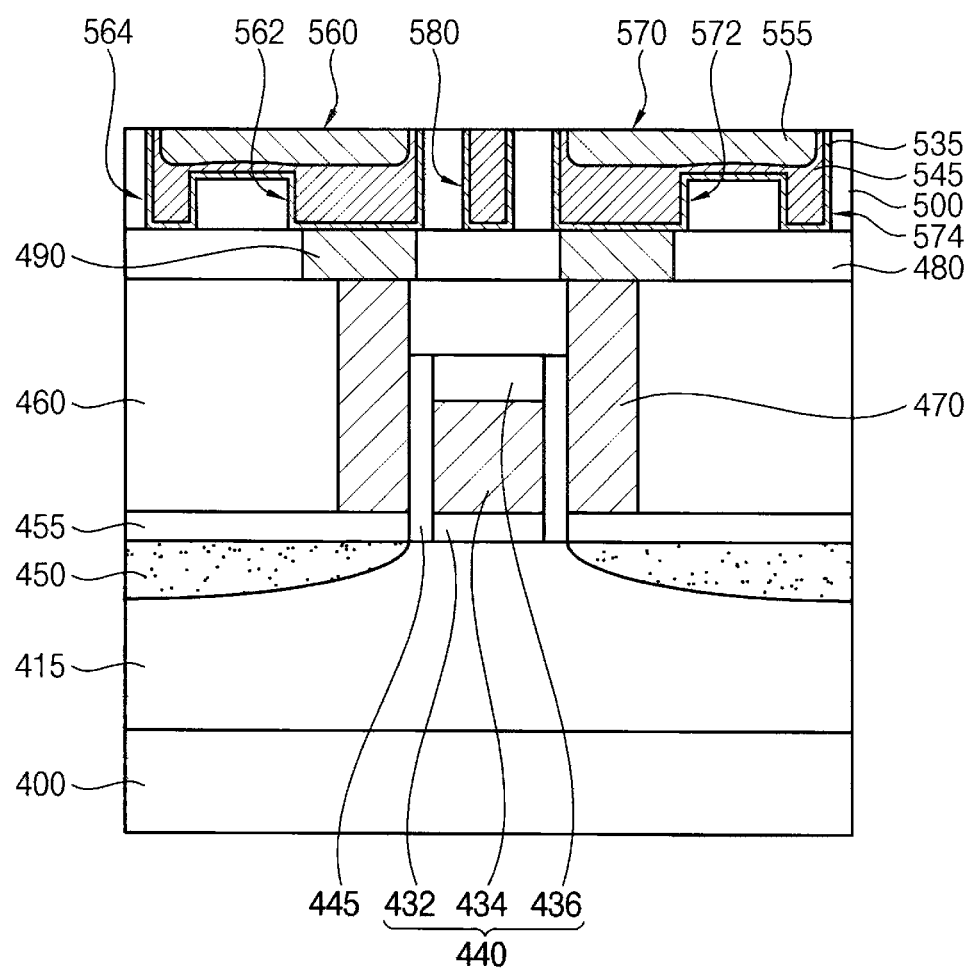

Referring to FIG. 52, as also illustrated with reference to FIG. 9, upper portions of the second metal layer 550, the first metal layer 540 and the liner layer 530 may be planarized by a CMP process to form a second metal pattern 555, a first metal pattern 545 and a liner pattern 535.

Accordingly, a first wiring including a first via structure 562, a first dummy via structure 564 and a first line structure 560 may be formed in the first opening. A second wiring including a second via structure 572, a second dummy via structure 574 and a second line structure 570 may be formed in the second opening. An isolated dummy via structure 580 may be formed in the isolated dummy via hole 515.

In example embodiments, the isolated dummy via structure 580 may be defined substantially by the liner pattern 535 and the first metal pattern 545.

According to example embodiments as described above, a reflow guide for the formation of the first metal layer 540 may be provided by a combination of the dummy via hole integrally connected to the opening for each wiring, and the isolated dummy via hole spaced apart from the openings. Therefore, the wirings having few or no defects, e.g., a void or a seam, may be formed in the trenches 520 and 525.

According to example embodiments of the present inventive concepts, in, e.g., a dual damascene process, a dummy via hole may be further formed together with a via hole exposing a lower wiring. A seed metal for forming a wiring structure may be filled from the via hole by a reflow process. A space for filling the seed metal may be additionally obtained by the dummy via hole, and thus a seed layer may be sufficiently formed on a surface of a trench connected to upper portions of the via hole and the dummy via hole. Thus, the wiring structure of relatively high reliability having few or no defects, e.g., a void or a seam therein, may be formed in the trench.

The wiring structure and the methods of forming the wiring structure may be employed for various semiconductor devices including fine patterns that may have a critical dimension less than about 20 nm or about 10 nm. The semiconductor devices may include a logic device having a FinFET structure, and memory devices, e.g., SRAM, DRAM, PRAM, MRA, RRAM or NAND flash memory devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a wiring structure, comprising:
   forming a lower structure on a substrate;
   forming an insulating interlayer on the lower structure;

partially removing the insulating interlayer to form at least one via hole and a dummy via hole;
partially removing an upper portion of the insulating interlayer to form a trench connecting the via hole and the dummy via hole;
forming a first copper layer filling the via hole and the dummy via hole; and
forming a second copper layer on the first copper layer, the second copper layer filling the trench.

2. The method of claim 1, further comprising:
forming a liner layer along sidewalls and bottom surfaces of the via hole, the dummy via hole, and the trench before the forming a first copper layer.

3. The method of claim 2, wherein the forming a liner layer includes forming the liner layer including a CVD-Ru (Chemical Vapor Deposition-Ruthenium).

4. The method of claim 1, wherein the forming a first copper layer includes forming the first copper layer by a reflow process.

5. The method of claim 4, wherein the forming a second copper layer includes forming the second copper layer by a plating process using the first copper layer as a seed.

6. The method of claim 4, wherein the forming a first copper layer includes forming the first copper layer using the dummy via hole as a reflow guide.

7. The method of claim 1, wherein:
the forming a first copper layer includes forming the first copper layer completely filling the via hole and the dummy via hole and extending continuously on a sidewall and a bottom surface of the trench.

8. The method of claim 1, wherein the partially removing an upper portion of the insulating interlayer includes forming the trench connecting the via hole to one end portion of the trench and connecting the dummy via hole to another end portion of the trench.

9. The method of claim 1, wherein:
the forming a lower structure includes forming a lower insulation layer and a lower wiring; and
the partially removing the insulating interlayer includes forming the via hole to at least partially expose a top surface of the lower wiring; and
the partially removing the insulating interlayer includes forming the dummy via hole to expose only the lower insulation layer.

10. The method of claim 9, wherein:
the partially removing the insulating interlayer includes forming a first via hole on one end portion of the trench and a second via hole on another end portion of the trench; and
the partially removing the insulating interlayer includes forming the dummy via hole between the first via hole and the second via hole.

11. The method of claim 10, wherein the partially removing the insulating interlayer includes forming the dummy via hole extending at least partially through the lower insulation layer.

12. The method of claim 1, further comprising:
forming an isolated dummy via hole through the insulating interlayer, the isolated dummy via hole being spaced apart from the trench.

13. The method of claim 12, wherein the forming a first copper layer includes forming the first copper layer filling the isolated dummy via hole.

14. A method of forming a wiring structure, comprising:
forming at least one lower wiring on a substrate;
forming an insulating interlayer on the lower wiring;
partially removing the insulating interlayer to form at least one via hole exposing the lower wiring and at least one dummy via hole separated from the lower wiring;
partially removing an upper portion of the insulating interlayer to form a trench connecting the via hole and the dummy via hole;
forming at least one via structure filling the via hole and the dummy via hole by a reflow process, the via structure including copper; and
forming a line structure on the via structure, the line structure including copper.

15. The method of claim 14, wherein:
the forming a line structure includes forming the line structure by a plating process using the via structure as a seed; and
the forming at least one via structure includes forming the via structure using the dummy via hole as a reflow guide.

* * * * *